United States Patent
Maki et al.

(10) Patent No.: US 7,759,164 B2
(45) Date of Patent: Jul. 20, 2010

(54) SEMICONDUCTOR MANUFACTURING METHOD OF DIE PICK-UP FROM WAFER

(75) Inventors: Hiroshi Maki, Kai (JP); Kazuhiro Seiki, Kai (JP); Eiji Wada, Kai (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/392,171

(22) Filed: Feb. 25, 2009

(65) Prior Publication Data
US 2009/0170290 A1 Jul. 2, 2009

Related U.S. Application Data

(62) Division of application No. 11/335,459, filed on Jan. 20, 2006, now Pat. No. 7,498,241.

(30) Foreign Application Priority Data

Jan. 21, 2005 (JP) .............................. 2005-013690

(51) Int. Cl.
*H01L 21/00* (2006.01)
(52) U.S. Cl. ...................... 438/113; 156/344; 156/584; 257/E21.598
(58) Field of Classification Search .................. 438/113
See application file for complete search history.

(56) References Cited

U.S. PATENT DOCUMENTS

| 712,447 | A | * | 10/1902 | Woolley | 220/230 |
| 4,556,362 | A | * | 12/1985 | Bahnck et al. | 414/744.3 |
| 4,859,269 | A | * | 8/1989 | Nishiguchi | 156/361 |
| 5,098,501 | A | * | 3/1992 | Nishiguchi | 156/275.5 |
| 5,589,029 | A | * | 12/1996 | Matsui et al. | 156/344 |
| 5,709,543 | A | * | 1/1998 | Shimazu | 432/241 |
| 6,201,306 | B1 | * | 3/2001 | Kurosawa et al. | 257/783 |
| 6,555,418 | B2 | * | 4/2003 | Kurosawa et al. | 438/118 |
| 6,774,011 | B2 | * | 8/2004 | Nakazawa et al. | 438/464 |
| 6,824,643 | B2 | * | 11/2004 | Yoshimoto et al. | 156/344 |

(Continued)

FOREIGN PATENT DOCUMENTS

EP 1575081 9/2005

(Continued)

OTHER PUBLICATIONS

Japanese Official Action dated Apr. 20, 2010, for Application No. 2005-013690.

*Primary Examiner*—David A Zarneke
(74) *Attorney, Agent, or Firm*—Antonelli, Terry, Stout & Kraus, LLP.

(57) ABSTRACT

A manufacturing method of a semiconductor device comprising the steps of: affixing a die attach film and a dicing film to a back surface of a semiconductor wafer: thereafter dicing the semiconductor wafer and the die attach film to divide the semiconductor wafer into a plurality of semiconductor chips: thereafter pulling the dicing film from the center toward the outer periphery of the dicing film with a first tensile force to cut the die attach film chip by chip; and thereafter picking up the semiconductor chips together with the die attach film while pulling the dicing film from the center toward the outer periphery of the dicing film with a second tensile force smaller than the first tensile force.

24 Claims, 34 Drawing Sheets

U.S. PATENT DOCUMENTS

| | | | |
|---|---|---|---|
| 7,129,150 B2 | 10/2006 | Kawai | |
| 7,238,258 B2 * | 7/2007 | Park et al. | 156/344 |
| 7,306,695 B2 * | 12/2007 | Kasai | 156/344 |
| 2004/0115904 A1 * | 6/2004 | Cheung et al. | 438/464 |
| 2004/0180473 A1 | 9/2004 | Kawai | |
| 2005/0274457 A1 * | 12/2005 | Cheung et al. | 156/344 |
| 2006/0019428 A1 * | 1/2006 | Kurosawa et al. | 438/114 |
| 2006/0252234 A1 * | 11/2006 | Saiki | 438/464 |

FOREIGN PATENT DOCUMENTS

| | | |
|---|---|---|
| JP | 06-275704 | 9/1994 |
| JP | 09-162205 | 6/1997 |
| JP | 11-183573 | 7/1999 |
| JP | 11-214487 | 8/1999 |
| JP | 11-344536 | 12/1999 |
| JP | 2000-147063 | 5/2000 |
| JP | 2000-265943 | 9/2000 |
| JP | 2002-346462 | 12/2002 |
| JP | 2003-121494 | 4/2003 |
| JP | 2004-146727 | 5/2004 |
| JP | 2004-193241 | 7/2004 |
| JP | 2004-200381 | 7/2004 |
| JP | 2004-273895 | 9/2004 |

* cited by examiner

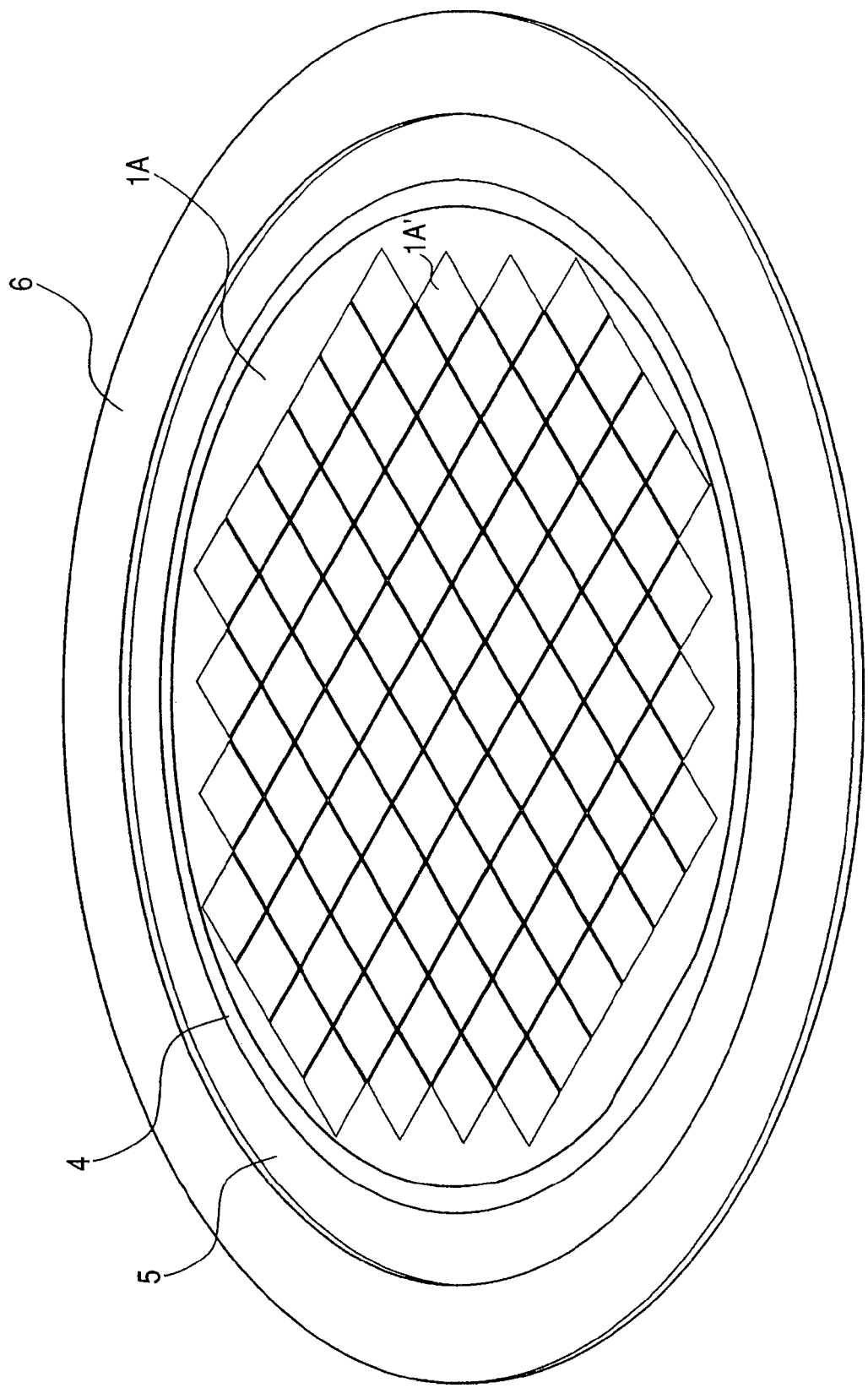

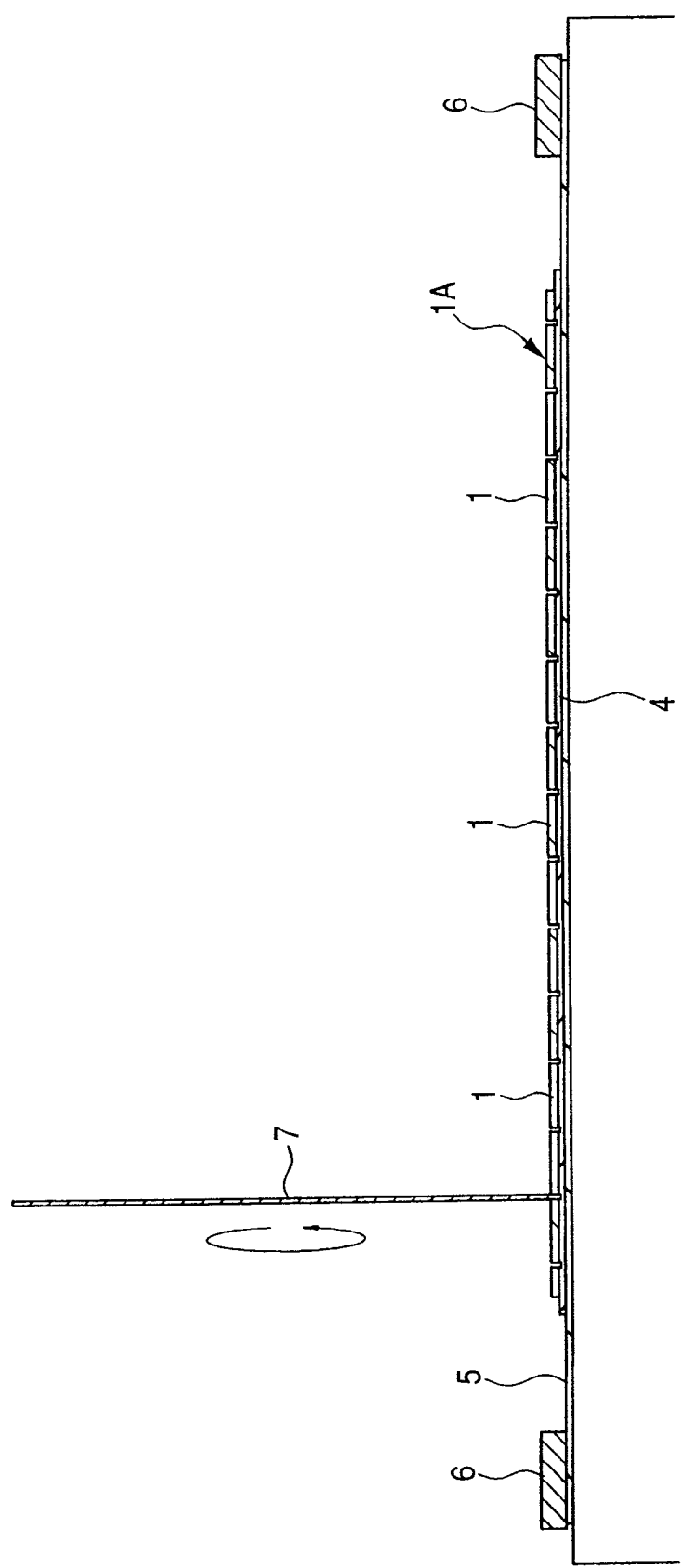

SEMICONDUCTOR MANUFACTURING METHOD OF DIE PICK-UP FROM WAFER

CROSS-REFERENCE TO RELATED APPLICATION

The present application claims priority from Japanese patent application No. 2005-013690 filed on Jan. 21, 2005, the content of which is hereby incorporated by reference into this application.

This application is a Divisional application of prior application Ser. No. 11/335,459, filed Jan. 20, 2006, now U.S. Pat. No. 7,498,241 the contents of which are incorporated herein by reference in their entirety.

BACKGROUND OF THE INVENTION

The present invention relates to a semiconductor device manufacturing technique and more particularly to a technique applicable effectively to the step of dividing a semiconductor wafer affixed to a dicing film into plural semiconductor chips and thereafter separating the semiconductor chips from the dicing film and the step of mounting each of the separated semiconductor chips onto a mounting base through a die bonding paste.

As steps included in a process of mounting a semiconductor chip (hereinafter referred to simply as "chip") onto a mounting base such as a wiring substrate or a lead frame to assemble a semiconductor package there are a pickup step of separating a chip from a semiconductor wafer (simply as "wafer" hereinafter) and picking it up and a pellet bonding step of bonding the picked-up chip onto a mounting base. The pickup step and the subsequent pellet bonding step are also called die bonding steps.

In the pickup step, dicing is performed in a state in which a dicing tape is affixed to the back surface of a wafer with a desired integrated circuit formed thereon, to divide the wafer into plural chips. Next, the chips are peeled off one by one while pushing needles or the like against the back surface of the dicing tape and thereafter each chip is conveyed onto a mounting base while being held by a collet.

In the next pellet bonding step, paste (adhesive) for die bonding is fed onto the mounting base with use of a paste applicator called a dispenser and the chip is bonded onto the mounting base through the paste. There also is known a method wherein a filmy adhesive material called die attach film is affixed beforehand to the back surface of a semiconductor chip and the chip is bonded onto a mounting base through the die attach film. In case of using the die attach film, dicing is performed while affixing both die attach film and dicing tape to the back surface of a wafer in the pickup step. Then, the divided chips are separated from the dicing tape together with the die attach film and are each conveyed onto the mounting base.

Japanese Unexamined Patent Publication No. 2004-146727 (Patent Literature 1) discloses a technique wherein a wafer on a wafer sheet is diced and thereafter the wafer sheet is expanded to divide the wafer into chips.

Japanese Unexamined Patent Publication No. Hei 11(1999)-214487 (Patent Literature 2) discloses a technique of expanding a wafer sheet by means of a locking ring.

Japanese Unexamined Patent Publication No. 2004-273895 (Patent Literature 3) and No. 2004-193241 (Patent Literature 4) disclose a technique of dividing a wafer affixed to a die attach film into chips.

Japanese Unexamined Patent Publication No. 2000-265943 (Patent Literature 5) and No. 2002-346462 (Patent Literature 6) disclose a technique wherein a scraping groove is formed in the outer periphery of a sealing disc connected to a plunger pump of a paste applicator, and paste leaking from a sealing surface is collected into the scraping groove, thereby improving the adhesion of the sealing surface.

Japanese Unexamined Patent Publication No. Hei 9(1997)-162205 (Patent Literature 7) discloses a technique of detecting a state of contact or non-contact between a dicing table and a needle with use of an electric circuit using a magnet.

Japanese Unexamined Patent Publication No. Hei 11(1999)-344536 (Patent Literature 8), No. Hei 11(1999)-183573 (Patent Literature 9), No. 2000-147063 (Patent Literature 10) and No. 2003-121494 (Patent Literature 11) disclose a technique of semi-fixing a probe testing needle with a magnet.

SUMMARY OF THE INVENTION

The present inventors found out that the following problems were involved in the die bonding step using a die attach film and the die bonding step using a paste applicator.

The dicing tape used in dicing a wafer is composed of a tape base and an ultraviolet curing type pressure-sensitive adhesive applied to one surface of the tape base. Therefore, when ultraviolet light is radiated to the back surface of the dicing tape to cure the pressure-sensitive adhesive after dicing the wafer affixed to the dicing tape, the adhesive force of the pressure-sensitive adhesive becomes weaker and chips becomes easier to peel off from the dicing tape.

However, in the case where a die attach film is interposed between the wafer and the dicing tape, the adjacent die attach film cannot be separated completely even if full-cut dicing is performed and hence the chips are difficult to peel off from the dicing tape.

Moreover, with a die attach film interposed between the wafer and the dicing tape, the die attach film is subsequently cut by stretching the dicing tape. It is optional whether the die attach film is to be separated or not when dicing the wafer. However, if a chip is picked up in a stretched state of the dicing tape, the chip may be cracked under the imposition of a local stress thereon. Particularly, as a recent tendency, chips formed thin to a thickness of several ten μm or so are often used to promote a high-density semiconductor packaging, thus giving rise to the problem that a crack is apt to occur at the time of pickup.

In the pickup step for chips, the chips are separated one by one while pushing needles or the thin rod against the back surface of the dicing tape. However, it is necessary to increase the number of needles when the chip size is large or decrease the number of needles when the chip size is small. That is, it is necessary to provide plural types of pickup devices according to chip sizes, thus giving rise to the problem that the equipment cost of the pickup step increases.

Next, a description will be given below about problems involved in the die bonding step using a paste applicator. FIG. 34 is a sectional view showing a principal portion of a dispenser which the present inventors have studied (not a prior art), FIG. 35 is a plan view of a sealing disc as a mechanical part of the said dispenser, and FIG. 36 is a sectional view taken along line A-A in FIG. 35.

The dispenser, indicated at 60, includes a main cylinder 61, a cap 62 bolted to a lower end of the main cylinder 61, and a block 63 bolted to a lower end of the cap 62. A suction port 64 and a discharge port 65 are formed in the interior of the block 63. A nozzle 66 is connected to a lower end portion of the discharge port 65 and a syringe 68 is connected to one end portion of the suction port 64 through a liquid feed tube 67.

The syringe 68 is a tank for the storage of die bonding paste and has a structure to transport the paste to the suction port 64 with air pressure for example.

A cylindrical sealing disc formed of a synthetic resin or a ceramic material is fixed in the interior of the cap 62. The sealing disc 69 has a suction hole 70 which is put in communication with an opposite end portion of the suction port 64 and a discharge hole 71 which is put in communication with an upper end portion of the discharge port 65. A generally arcuate suction groove 72 connected to the suction hole 70 is formed in part of an upper surface of the sealing disc 69 and a generally arcuate discharge groove 73 connected to the discharge hole 71 is formed in another part of the upper surface of the sealing disc 69.

A cylindrical valve disc 74 formed of a ceramic material is disposed on top of the sealing disc 69 so as to be rotatable while a lower surface thereof slides relative to the upper surface of the sealing disc 69. For example three plunger inserting holes 75 are formed through both upper and lower surfaces of the valve disc 74.

For example three plungers 76 are disposed above the valve disc 74 vertically movably, lower end portions of the plungers 76 being inserted respectively into the plunger inserting holes 75.

When the valve disc 74 is rotated by a rotational drive means such as a motor (not shown), the rotation of the motor is converted to a vertical motion by a cam mechanism (not shown) and the plungers 76 advance or retreat vertically within the plunger inserting holes 75 of the valve disc 74.

When a plunger inserting hole 75 moves to a position overlapping the suction groove 72 of the sealing disc 69 with rotation of the valve disc 74, the associated plunger rises and a negative pressure is developed within the plunger inserting hole 75. Consequently, the paste stored within the syringe 68 passes through the liquid feed tube 67, suction port 64, suction hole 70 and suction groove 72 and is sucked into the plunger inserting hole 75. Next, when the valve disc 74 further rotates and the plunger inserting hole 75 moves to a position overlapping the discharge groove 73, the plunger 76 moves down and causes the paste present within the plunger inserting hole 75 to be discharged from the tip of the nozzle 66 through the discharge groove 73, discharge hole 71 and discharge port 65. In this way, the suction and discharge of paste are repeated each time the valve disc 74 rotates once, whereby a predetermined amount of paste is applied to a predetermined position of the mounting base.

According to the structure of the dispenser 60 described above, the valve disc 74 rotates while its lower surface slides relative to the upper surface of the sealing disc 69. Therefore, if a slight gap is formed between the sliding surfaces due to variations in flatness of each of lower surface of the valve disc 75 and the upper surface of the sealing disc 69, a portion of the paste present in the interior of the plunger inserting hole 75 and the interior of the discharge groove 73 which have been pressurized by the downward movement of the plunger 76 leaks out to the sliding surfaces.

However, since a hard filler such as silicon filler is contained in the die bonding paste, if the valve disc 74 is continued to rotate in a leaking state of the paste to the sliding surfaces, the sliding surfaces become worn and the gap becomes wider, so that the paste leaks out to the exterior of the sliding surfaces. As a result, there arises the problem that the amount of the paste fed to the mounting base varies. Besides, if the paste leaking out to the exterior of the sliding surfaces solidifies in the interior of the dispenser 60, a smooth operation of mechanical parts is obstructed, thus giving rise to the problem that the maintenance frequency for the dispenser 60 increases.

It is an object of the present invention to provide a die bonding technique whereby chips affixed to a dicing tape through a die attach film can be picked up rapidly without the occurrence of cracking or chipping of a semiconductor chip.

It is another object of the present invention to provide a technique which permits the reduction of cost of a device for picking up chips affixed to a dicing tape.

It is a further object of the present invention to provide a die bonding technique which permits a die bonding paste to be fed in a stable amount onto a mounting base.

The above and other objects and novel features of the present invention will become apparent from the following description and the accompanying drawings.

The following is an outline of typical modes of the present invention as disclosed herein.

(1) A manufacturing method of a semiconductor device comprises the steps of:

(a) affixing a die attach film and a dicing film to a back surface of a semiconductor wafer;

(b) after the step (a), dicing the semiconductor wafer and the die attach film to divide the semiconductor wafer into a plurality of semiconductor chips;

(c) after the step (b), pulling the dicing film from the center toward the outer periphery of the dicing film with a first tensile force to cut the die attach film chip by chip; and (d) after the step (c), picking up the semiconductor chips together with the die attach film while pulling the dicing film from the center toward the outer periphery of the dicing film with a second tensile force smaller than the first tensile force.

(2) A manufacturing method of a semiconductor device comprises the steps of:

(a) affixing a dicing film to a back surface of a semiconductor wafer;

(b) after the step (a), dicing the semiconductor wafer to divide the semiconductor wafer into a plurality of semiconductor chips; and (c) after the step (b), sticking up a back surface of the dicing film by a stick-up means of a pickup means to suck the stuck-up semiconductor chips to a collet, thereby separating the semiconductor chips from the dicing film, the stick-up means comprising a plurality of needles having tips for contact with the back surface of the dicing film, a magnet for fixing rear ends of the plural needles, and a needle holder which includes a plurality of through holes each having an inside diameter slightly larger than the diameter of each of the needles and controls the attitude of the needles inserted respectively into the plural through holes.

(3) A manufacturing method of a semiconductor device comprises the steps of:

(a) affixing a dicing film to a back surface of a semiconductor wafer;

(b) after the step (a), dicing the semiconductor wafer to divide the semiconductor wafer into a plurality of semiconductor chips;

(c) after the step (b), sticking up a back surface of the dicing film by a stick-up means of a pickup means to suck the stuck-up semiconductor chips to a collet, thereby separating the semiconductor chips from the dicing film;

(d) feeding a die bonding paste discharged from a nozzle of a dispenser onto a mounting base; and (e) mounting the semiconductor chips picked up in the step (c) onto the mounting base through the paste, the dispenser comprising a block having a suction port and a discharge port, a sealing disc fixed onto the block and having a lower surface in contact with the block and an upper surface opposite to the lower surface, a valve disc having a lower surface adapted to rotate in sliding abutment against the upper surface of the sealing disc and further having a plunger inserting hole formed through both upper and lower surfaces thereof, and a plunger supported vertically movably and inserted partially into the plunger inserting hole of the valve disc, the sealing disc having a suction hole which is put in communication with the suction port of the block and a discharge hole which is put in communication with the discharge port of the block, the upper surface of the sealing disc being formed with a suction groove connected to the suction hole and a discharge groove connected to the discharge hole, the suction groove being formed in the upper surface of the sealing disc so as to surround the entire periphery of the discharge groove.

(4) A manufacturing method of a semiconductor device comprises the steps of:

(a) affixing a die attach film and a dicing film to a back surface of a semiconductor wafer;

(b) after the step (a), dicing the semiconductor wafer and the dicing film to divide the semiconductor wafer into a plurality of semiconductor chips;

(c) after the step (b), pulling the dicing film from the center toward the outer periphery of the dicing film with a first tensile force to cut the die attach film chip by chip; and (d) after the step (c), while pulling the dicing film from the center toward the outer periphery of the dicing film with a second tensile force smaller than the first tensile force, sticking up a back surface of the dicing film by a stick-up means of a pickup means to suck the stuck-up semiconductor chips to a collet, thereby separating the semiconductor chips together with the die attach film from the dicing film, the stick-up means comprising a plurality of needles having tips for contact with the back surface of the dicing film, a magnet for fixing rear ends of the plural needles, and a needle holder which includes a plurality of through holes each having an inside diameter slightly larger than the diameter of each of the needles and controls the attitude of the needles inserted respectively into the plural through holes, the semiconductor chips being stuck up from the back surface of the dicing film using the stick-up means.

(5) A semiconductor manufacturing apparatus comprises a pickup means for sticking up, using the stick-up means, a back surface of a dicing film with a plurality of semiconductor chips bonded to a surface thereof to suck the stuck-up semiconductor chips to a collet, thereby separating the plural semiconductor chips from the dicing film, wherein the stick-up means comprises a plurality of needles having tips for contact with the back surface of the dicing film, a magnet for fixing rear ends of the plural needles, and a needle holder which includes a plurality of through holes each having an inside diameter slightly larger than the diameter of each of the needles and controls the attitude of the needles inserted respectively into the plural through holes.

(6) In the above semiconductor manufacturing apparatus, the number of the needles attached to the pickup means is increased or decreased in accordance with the size of each of the semiconductor chips.

(7) In the above semiconductor manufacturing apparatus, a portion of the plural needles and the remaining portion thereof are adapted to vertically move independently of each other.

(8) A manufacturing method of a semiconductor device comprises the step of feeding a die bonding paste discharged from a nozzle of a dispenser onto a mounted base and thereafter mounting semiconductor chips onto the mounting base through the paste, the dispenser comprising a block having a suction port and a discharge port, a sealing disc fixed onto the block and having a lower surface in contact with the block and an upper surface opposite to the lower surface, a valve disc having a lower surface adapted to rotate in sliding abutment against the upper surface of the sealing disc and further having a plunger inserting hole formed through both upper and lower surfaces thereof, and a plunger supported vertically movably and inserted partially into the plunger inserting hole of the valve disc, the sealing disc having a suction hole which is put in communication with the suction port of the block and a discharge hole which is put in communication with the discharge port of the block, the upper surface of the sealing disc being formed with a suction groove connected to the suction hole and a discharge groove connected to the discharge hole, the suction groove being formed in the upper surface of the sealing disc so as to surround the entire periphery of the discharge groove.

(9) In the above manufacturing method of a semiconductor device, in the upper surface of the sealing disc, the suction groove is the widest near the suction hole and is narrow in a region spaced away from the suction hole.

(10) In the above manufacturing method of a semiconductor device, the suction hole of the sealing disc is formed through the sealing disc in a portion positioned on the center side with respect to the discharge hole, while the discharge hole is formed through the sealing disc in a direction perpendicular to both upper and lower surfaces of the sealing disc in a portion positioned on an outer side with respect to the suction hole.

(11) In the above manufacturing method of a semiconductor device, the sealing disc is formed of a ceramic material and the upper surface thereof is formed to a flatness of not larger than 0.001 mm.

(12) In the above manufacturing method of a semiconductor device, an edge for recovery of the paste leaking out onto the upper surface of the sealing disc is formed in a side wall surface of the sealing disc.

(13) A manufacturing method of a semiconductor device comprises the steps of:

(a) affixing a dicing film to a back surface of a semiconductor wafer;

(b) after the step (a), dicing the semiconductor wafer to divide the semiconductor wafer into a plurality of semiconductor chips;

(c) after the step (b), sticking up a back surface of the dicing film by a stick-up means of a pickup means to suck the stuck-up semiconductor chips to a collet, thereby separating the semiconductor chips from the dicing film;

(d) feeding a die bonding paste discharged from a nozzle of a dispenser to a mounting base; and (e) mounting the semiconductor chips stuck up in the step (c) onto the mounting base through the paste, the dispenser comprising a block having a suction port and a discharge port, a sealing disc fixed onto the block and having a lower surface in contact with the block and an upper surface opposite to the lower surface, a valve disc having a lower surface adapted to rotate in sliding abutment against the upper surface of the sealing disc and further having a plunger inserting hole formed through both upper and lower surfaces thereof, and a plunger supported vertically movably and inserted partially into the plunger inserting hole of the valve disc, the sealing disc having a suction hole which is put in communication with the suction port of the block and a discharge hole which is put in communication with the discharge port of the block, the upper surface of the sealing disc being formed with a suction groove connected to the suction hole and a discharge groove connected to the discharge hole, the suction groove of the sealing disc being formed in the upper surface of the sealing disc so as to surround the entire periphery of the discharge groove.

(14) A semiconductor manufacturing apparatus comprises a dispenser for feeding a die bonding paste onto a mounting base, wherein the dispenser comprises a block having a suction port and a discharge port, a sealing disc fixed onto the block and having a lower surface in contact with the block and an upper surface opposite to the lower surface, a valve disc having a lower surface adapted to rotate in sliding abutment against the upper surface of the sealing disc and further having a plunger inserting hole formed through both upper and lower surfaces thereof, and a plunger supported vertically movably and inserted partially into the plunger inserting hole of the valve disc, the sealing disc having a suction hole which is put in communication with the suction port of the block and a discharge hole which is put in communication with the discharge port of the block, the upper surface of the sealing disc being formed with a suction groove connected to the suction hole and a discharge groove connected to the discharge hole, the suction groove being formed in the upper surface of the sealing disc so as to surround the entire periphery of the discharge groove.

(15) In the above semiconductor manufacturing apparatus, in the upper surface of the sealing disc, the suction groove is the widest near the suction hole and is narrow in a region spaced away from the suction hole.

(16) In the above semiconductor manufacturing apparatus, the suction hole of the sealing disc is formed through the sealing disc in a portion positioned on the center side with respect to the discharge hole, while the discharge hole is formed through the sealing disc in a direction perpendicular to both upper and lower surfaces of the sealing disc in a portion positioned on an outer side with respect to the suction hole.

(17) In the above semiconductor manufacturing apparatus, the sealing disc is formed of a ceramic material and the upper surface thereof is formed to a flatness of not larger than 0.001 mm.

(18) In the above semiconductor manufacturing apparatus, an edge for recovery of the paste leaking out onto the upper surface of the sealing disc is formed in a side wall surface of the sealing disc.

The following is a brief description of effects obtained by the typical modes of the present invention as disclosed herein.

The chips affixed to the dicing tape through the die attach film can be picked up rapidly without the occurrence of cracking or chipping.

It is possible to reduce the cost of the device for picking up the chips affixed to the dicing tape.

The die bonding paste can be fed in a stable amount onto the mounting base.

BRIEF DESCRIPTION OF THE DRAWINGS

FIG. 4 is a perspective view showing a dicing step for the semiconductor wafer;

FIG. 5 is a side view showing the dicing step for the semiconductor wafer;

DETAILED DESCRIPTION OF PREFERRED EMBODIMENTS

Figure 1:
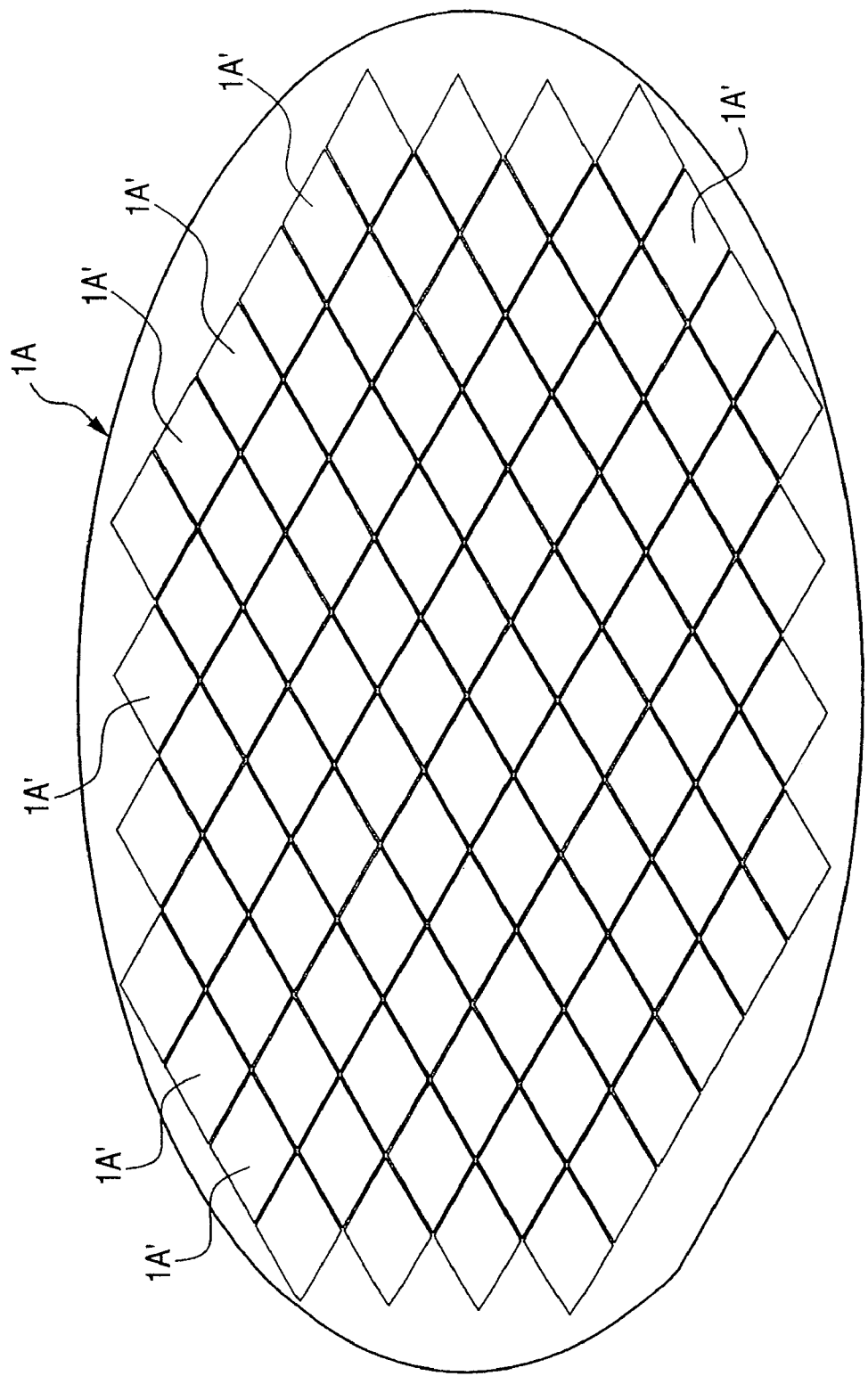
FIG. 1 is a perspective view of semiconductor chips used in manufacturing a semiconductor device according to an embodiment of the present invention.

Embodiments of the present invention will be described in detail hereinunder with reference to the accompanying drawings. In all of the drawings for illustrating the embodiments, the same members are identified by the same reference numerals in principle, and repeated explanations thereof will be omitted.

First Embodiment

A manufacturing method of a semiconductor device according to a first embodiment of the present invention will be described below step by step with reference to FIGS. 1 to 21.

First, there is provided such a wafer 1A of a single crystal silicon as shown in FIG. 1. A main surface of the wafer 1A is partitioned into plural chip regions 1A' and an integrated circuit is formed on each chip region 1A' by a known semiconductor manufacturing process.

Figure 2:
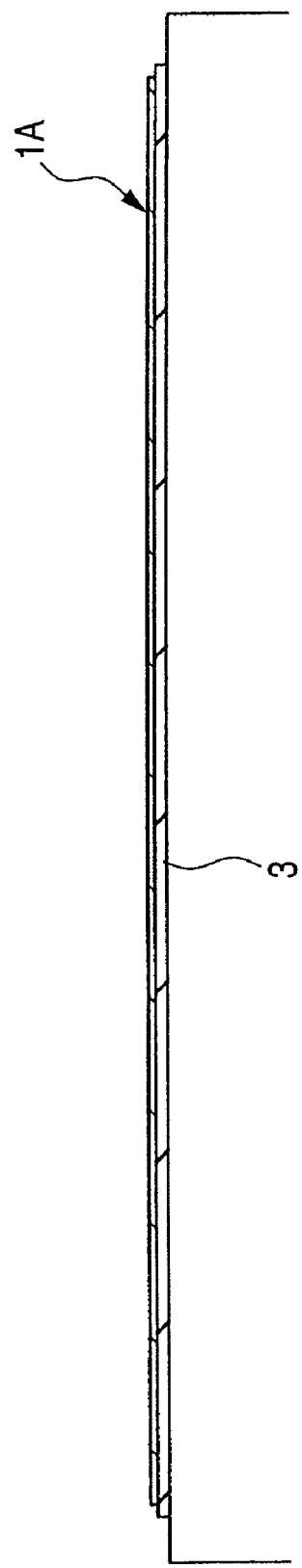
FIG. 2 is a side view showing a grinding step for a semiconductor wafer.

Next, as shown in FIG. 2, a back grinding tape 3 for protection of the integrated circuit is affixed to the main surface (the lower surface side in the figure) of the wafer 1A. In this state, grinding is performed for a back surface (the upper surface side in the figure) of the wafer 1A by means of a grinder and thereafter a damaged layer resulting from the grinding is removed by such a method as wet etching, dry polishing or plasma etching, thereby thinning the wafer 1A to a thickness of not larger than 100 µm, e.g., 30 to 60 µm.

Figure 3:
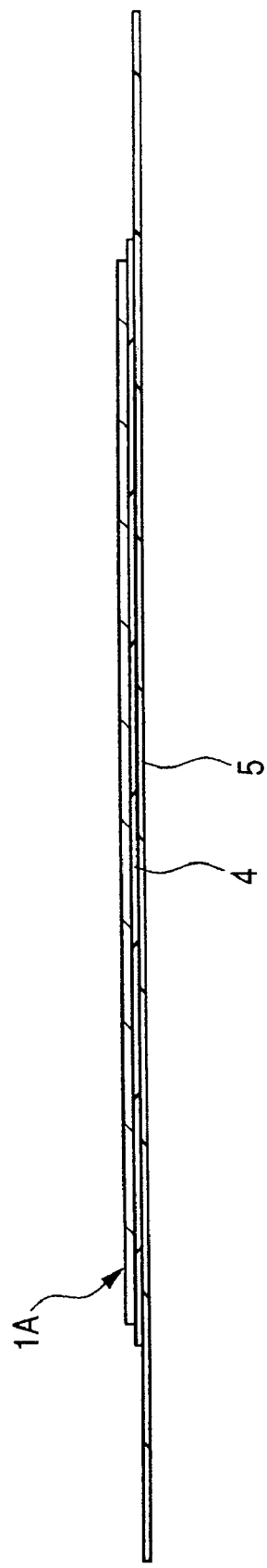
FIG. 3 is a side view showing a step of affixing a die attach film and a dicing tape to the semiconductor wafer.

Next, the back grinding tape 3 is peeled off from the main surface of the wafer 1A and thereafter, as shown in FIG. 3, a die attach film 4 is affixed to the back surface of the wafer 1A, further, a dicing tape 5 is affixed to a back surface of the die attach film 4. The die attach film 4 is a filmy adhesive material of about 20 to 100 µm in thickness which constitutes an adhesive layer at the time of mounting chips obtained by later-described dicing of the wafer 1A onto a mounting base such as other chips or a wiring substrate. The dicing tape 5 is a tape of about 90 to 120 µm in thickness comprising a tape base such as polyolefin (PO) or polyvinyl chloride (PVC) and an ultraviolet curing type pressure-sensitive adhesive or the like applied to one surface of the tape base to impart tackiness to the tape.

Figure 6A:
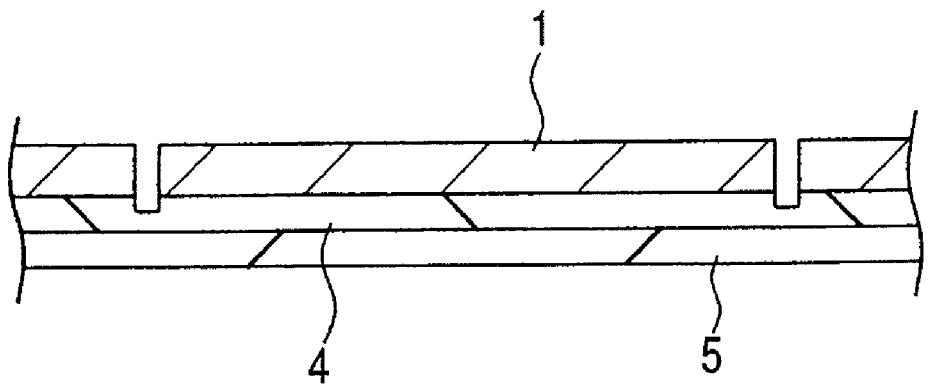
FIGS. 6(a), 6(b) and 6(c) are schematic sectional views each showing a state of the die attach film in the dicing step for the semiconductor wafer.
Figure 6B:
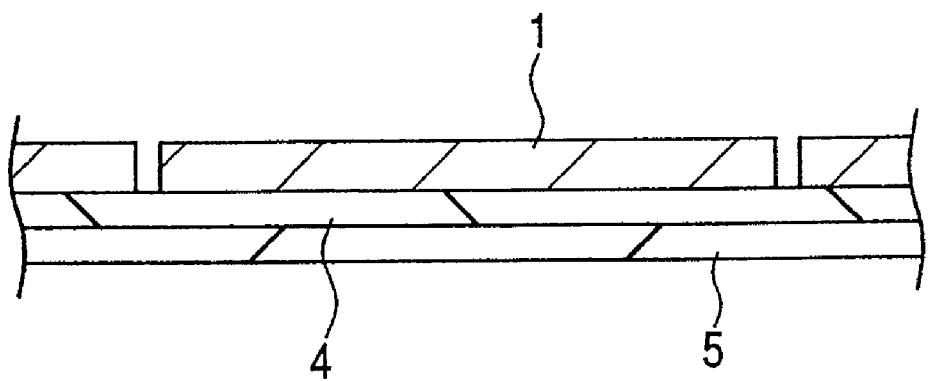
Figure 6C:
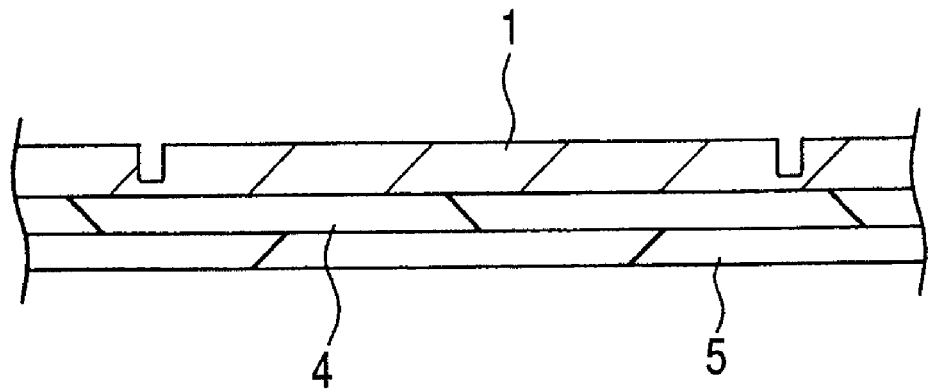

Next, as shown in FIG. 4, a wafer ring 6 is bonded to an outer periphery portion of a surface of the dicing table 5, then, as shown in FIG. 5, the wafer 1A is diced using a dicing blade 7 to divide the plural chip regions 1A' into chips 1. At this time, the dicing tape 7 is not cut. As to the die attach film 4, it is desirable for the same film to be cut completely. However, the die attach film 4 may be cut while allowing a part thereof to remain (half-cutting) as shown in FIG. 6(a), or only the wafer 1A may be diced without cutting the die attach film 4 as shown in FIG. 6(b), or only the wafer 1A may be half-cut and separated using a pickup device which will be described later, as shown in FIG. 6(c).

Figure 7:
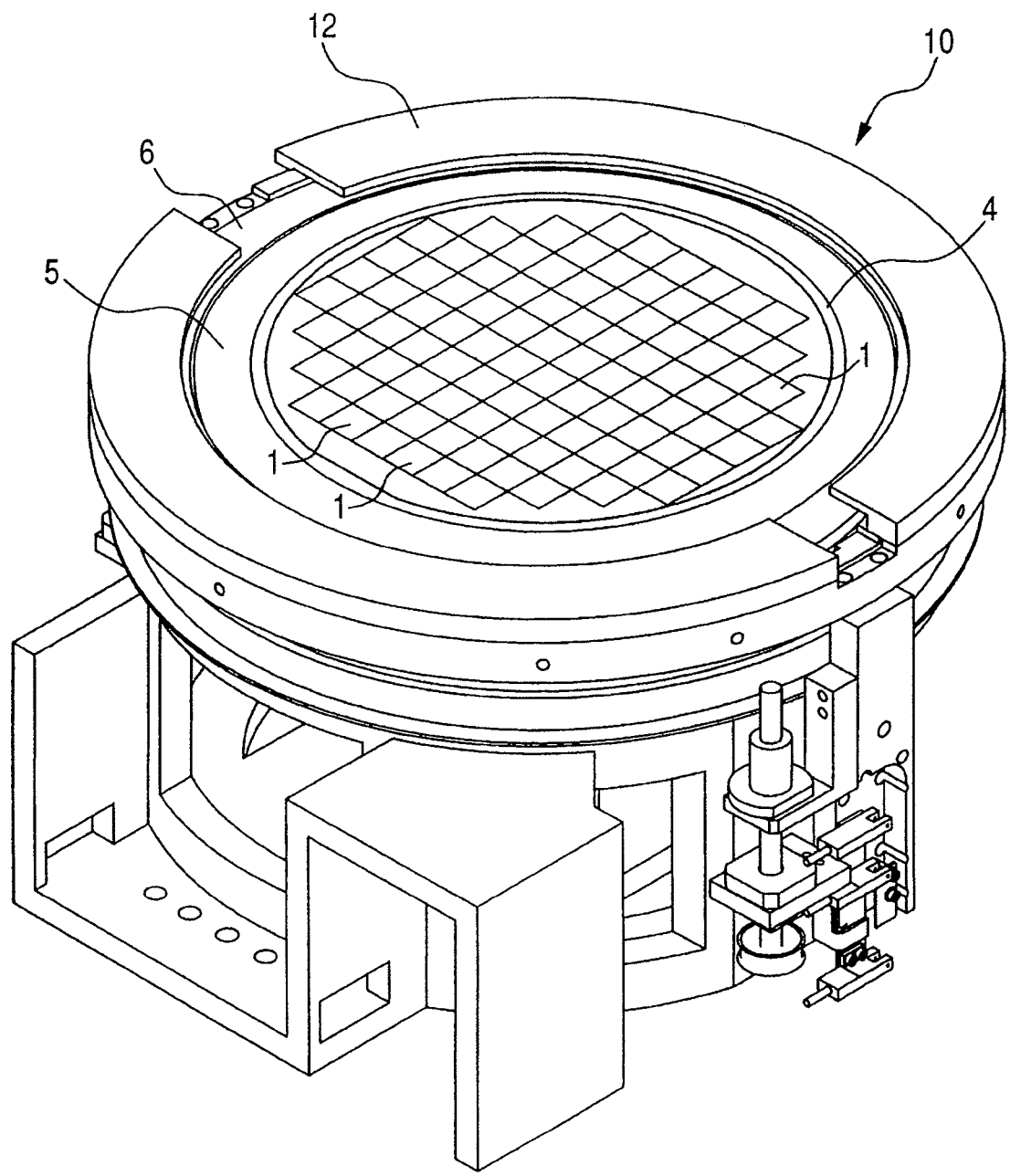
FIG. 7 is a perspective view showing an appearance of a pickup device.
Figure 8:
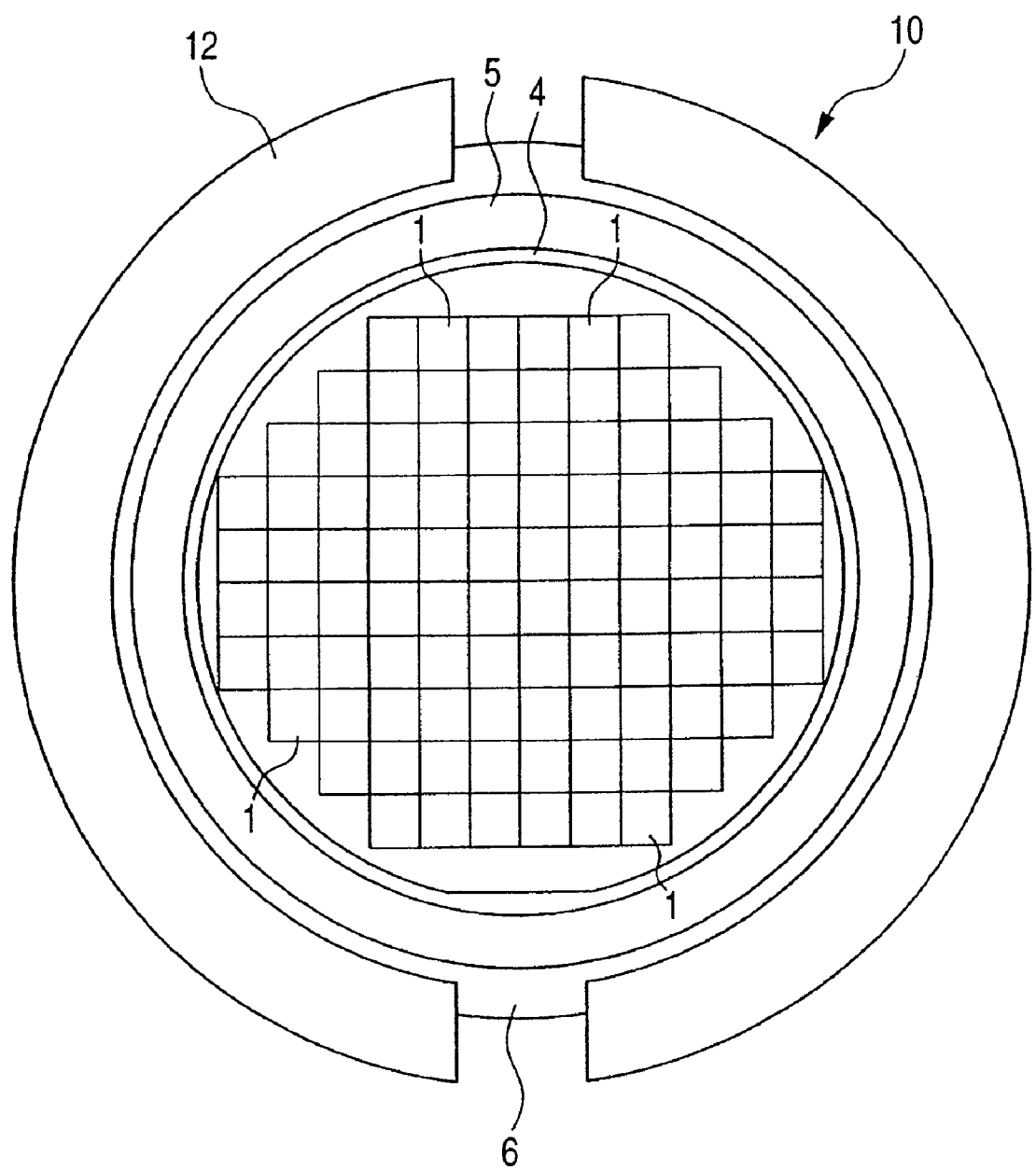
FIG. 8 is a schematic plan view showing a positional relation between a wafer ring and an expand ring in the pickup device.
Figure 9:
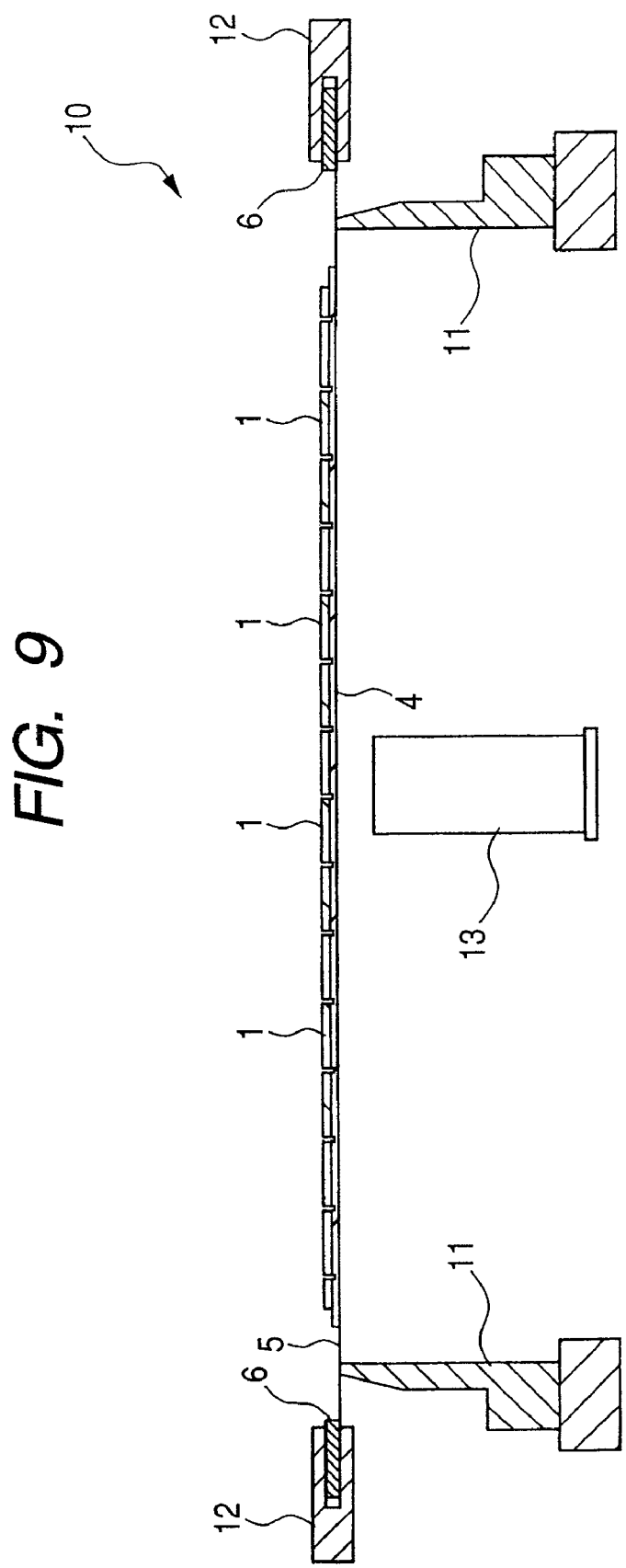
FIG. 9 is a schematic sectional view showing a positional relation among the wafer ring, a support ring and the expand ring in the pickup device.

Next, as shown in FIGS. 7 to 9, the dicing tape 5 with plural chips 1 bonded thereto is positioned horizontally onto a support ring 11 of a pickup device 10 and the wafer ring 6 bonded to the outer periphery portion of the dicing tape 5 is held by an expand ring 12. FIG. 7 is a perspective view showing an appearance of the pickup device 10, FIG. 8 is a schematic plan view showing a positional relation between the wafer ring 6 and the expand ring 12, and FIG. 9 is a schematic sectional view showing a positional relation among the wafer ring 6, support ring 11 and expand ring 12. As shown in FIG. 9, a chucking element 13 for pushing up each chip 1 is disposed inside the support ring 11. With a drive mechanism (not shown), the chucking element 13 is adapted to move horizontally and vertically.

Figure 10:
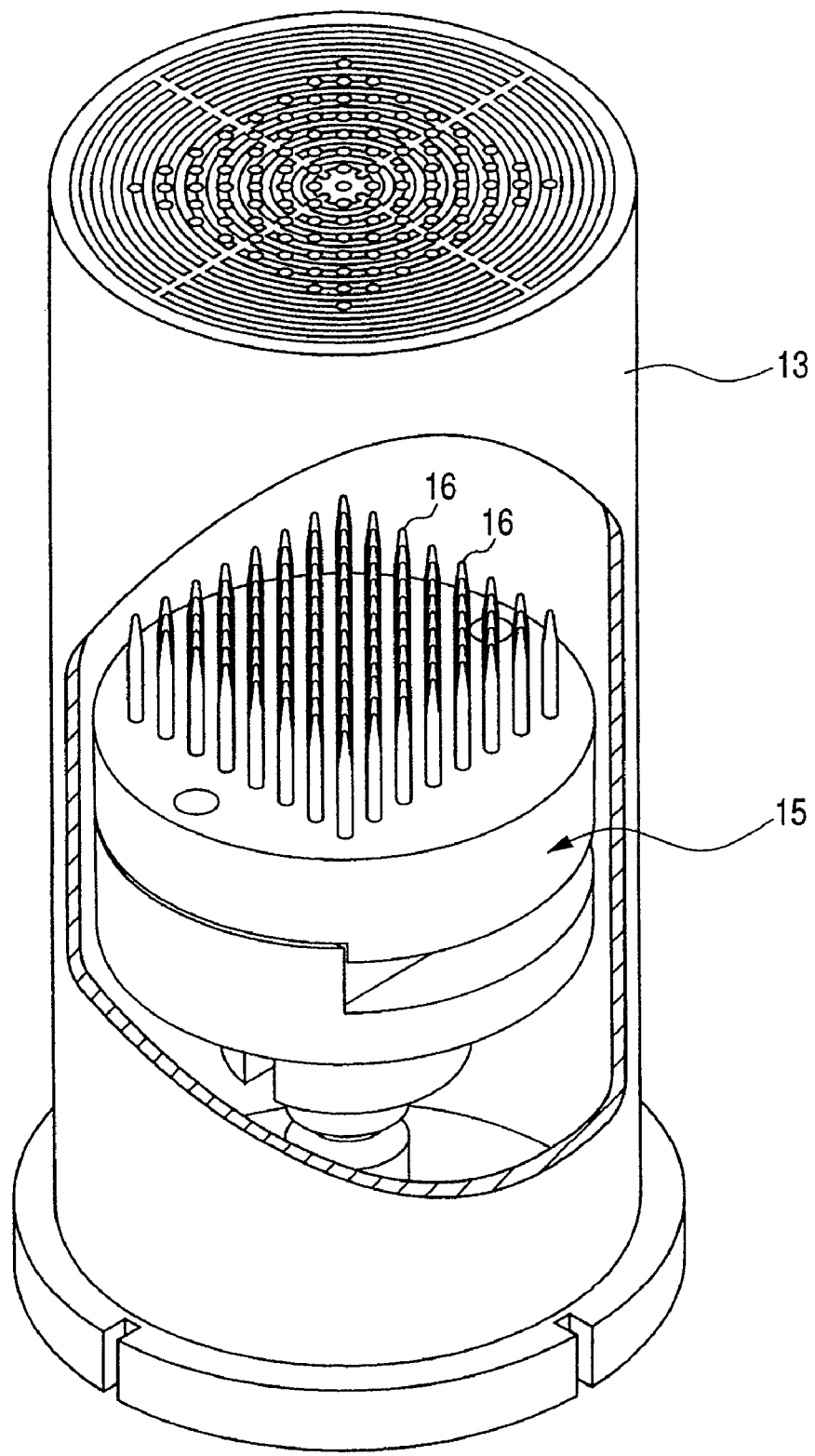
FIG. 10 is a partially broken-away perspective view showing a principal portion of a chucking element.
Figure 11:
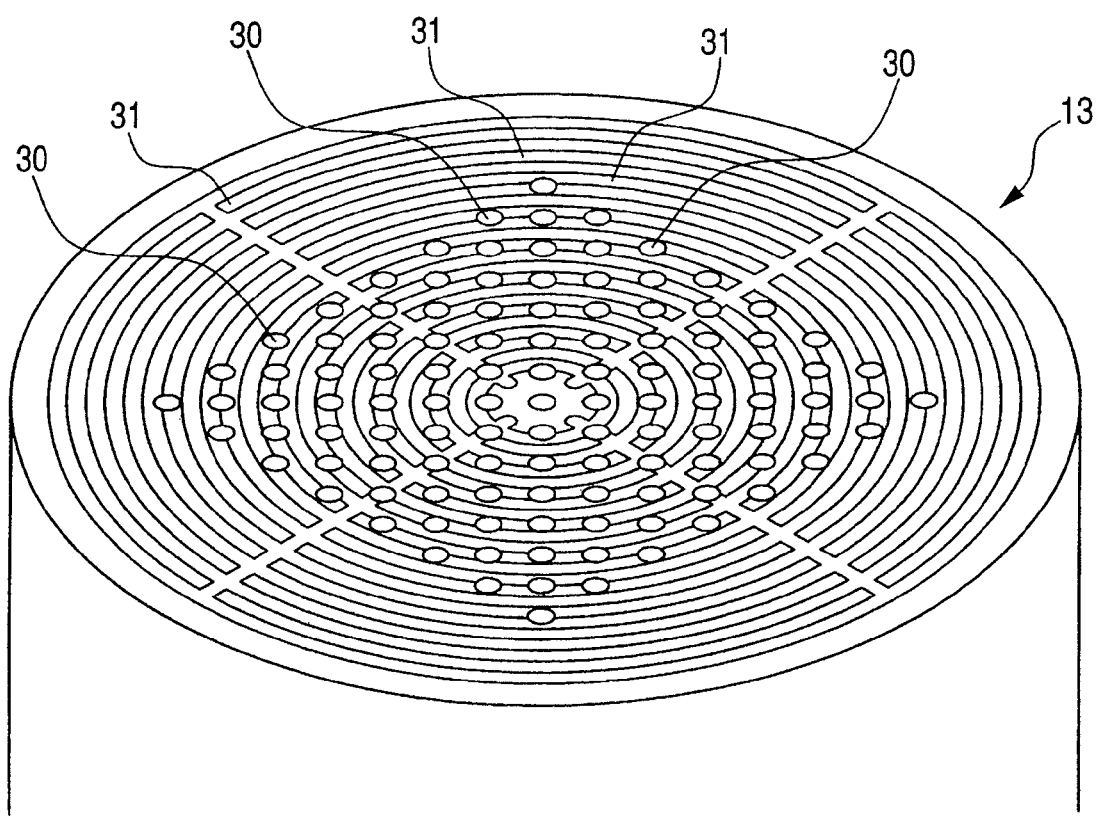
FIG. 11 is an enlarged perspective view of an upper surface and the vicinity thereof of the chucking element.

FIG. 10 is a partially broken-away perspective view showing a principal portion of the chucking element 13 and FIG. 11 is an enlarged perspective view of an upper surface and the vicinity thereof of the chucking element 13.

A pickup unit 1 is accommodated in the interior of the chucking element 13 which has a columnar contour. Plural needles 16 for pushing up a back surface of the dicing tape 5 are provided on an upper surface of the pickup unit 15. With a drive mechanism (not shown), the pickup unit 15 is adapted to move vertically in the interior of the chucking element 13.

Plural suction holes 30 and plural concentric slots 31 are formed in the peripheral portion of the upper surface of the chucking element 13. The suction holes 30 also serve as holes for allowing the tips of the needles 16 formed on the pickup unit 15 to project from the upper surface of the chucking element 13. The interior of the chucking element 13 is pressure-reduced by an evacuating mechanism, and when the chucking element 13 is raised to bring its upper surface into contact with the back surface of the dicing tape 5, the dicing tape back surface comes into close contact with the chucking element upper surface.

Figure 12:
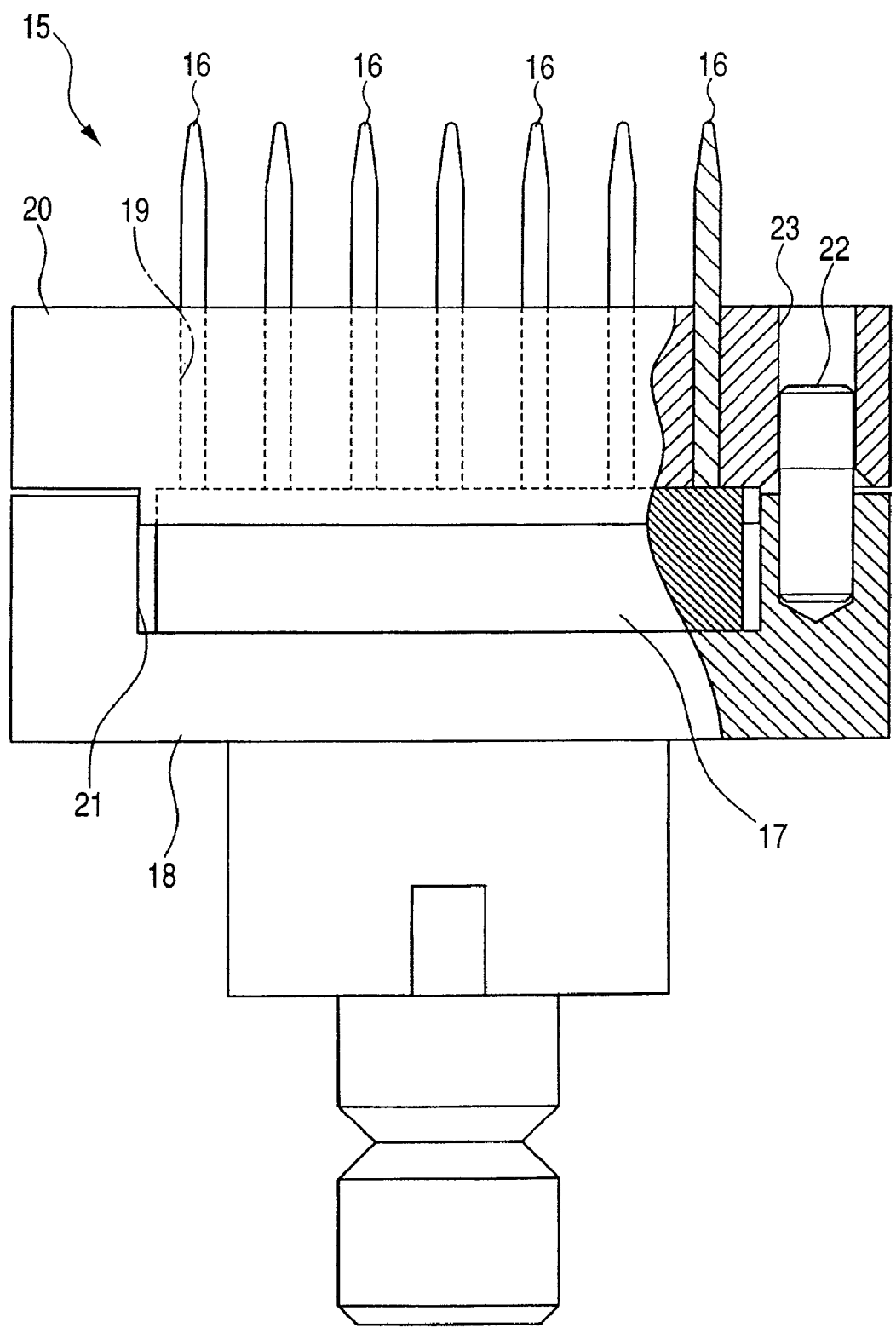
FIG. 12 is a partially broken-away sectional view of a pickup unit accommodated in the interior of the chucking element.
Figure 13:
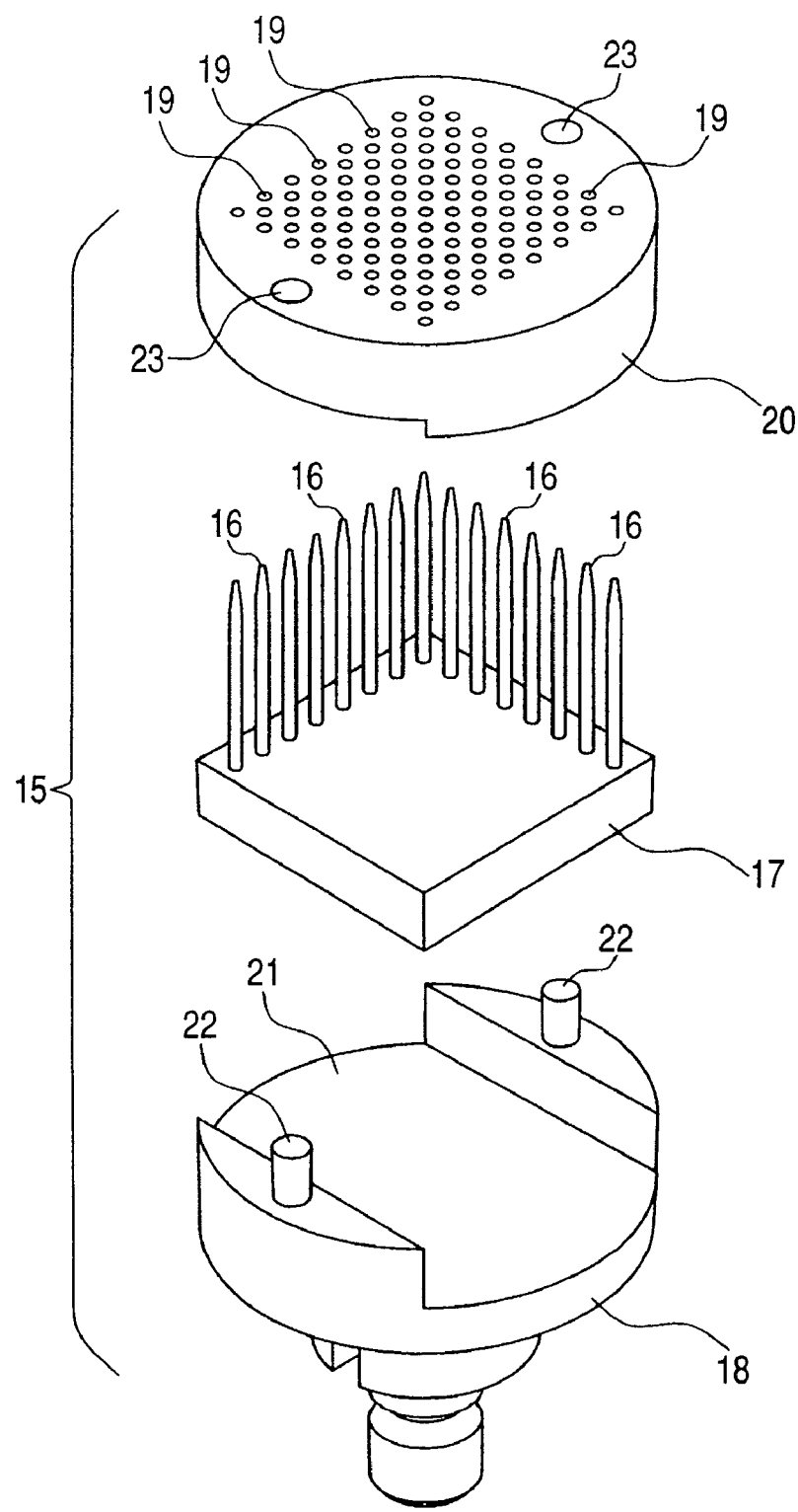
FIG. 13 is an exploded perspective view of the pickup unit.
Figure 14A:
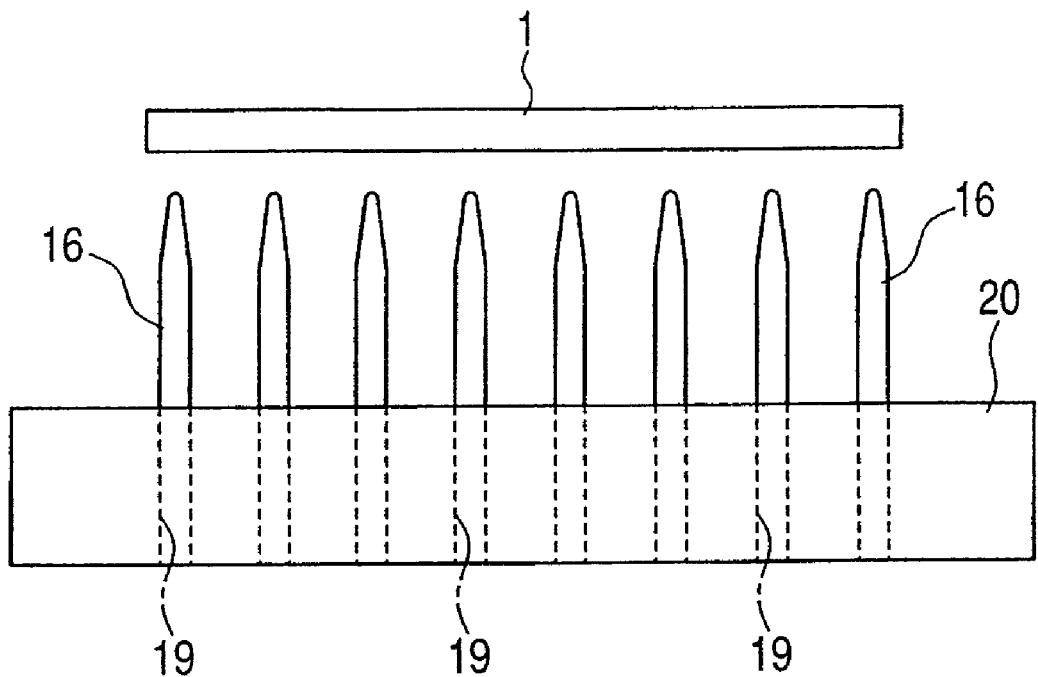
FIGS. 14(a) and 14(b) are side views each showing the number of needles inserted into through holes formed in a needle holder.
Figure 14B:
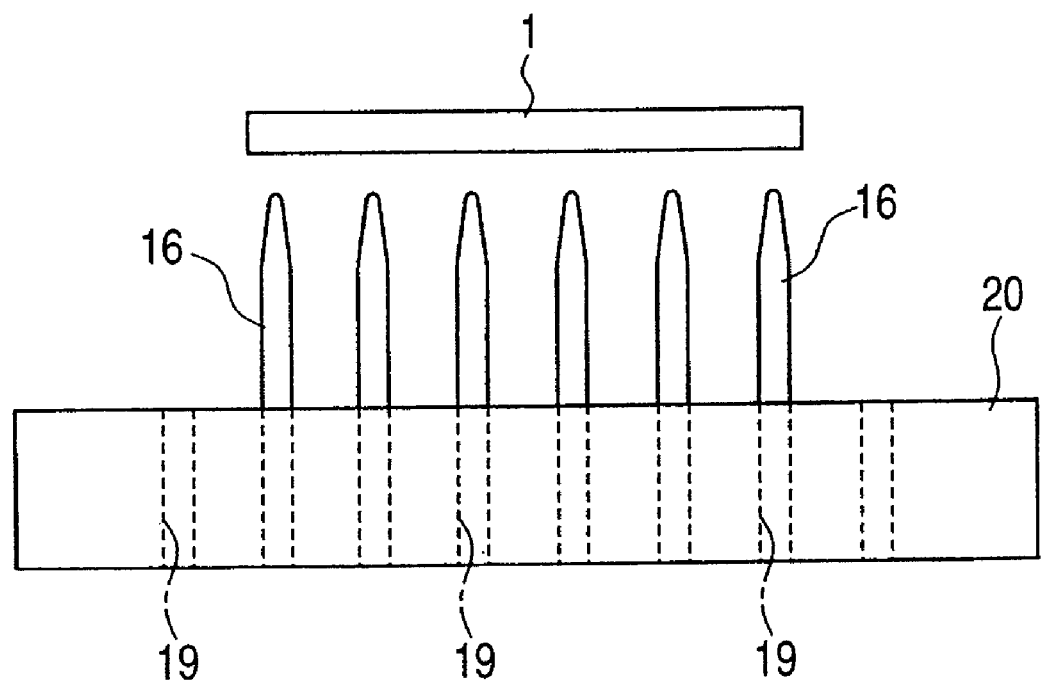

FIG. 12 is a partial broken-away sectional view of the pickup unit 15 accommodated in the interior of the chucking element 13 and FIG. 13 is an exploded perspective view of the pickup unit 15. The pickup unit 15 is made up of plural needles 16, a permanent magnet 17, a magnet holder 18 for holding the permanent magnet 17, and a needle holder 20 in which there are formed plural through holes 19 in a closely spaced manner. The plural needles 16 are made of a magnetic material such as metal containing iron as a main component and are formed so as to be mutually equal in dimensions (length and diameter). The permanent magnet 17 has a contour in the shape of a rectangular parallelepiped and an upper surface thereof is formed flat so as to have neither concaves nor convexes. The inside diameter of each of the through holes 19 formed in the needle holder 20 is slightly larger than the diameter of each needle 16 and the length thereof is shorter than the length of each needle 16.

For assembling the pickup unit 15, the permanent magnet 17 is fitted in a groove 21 formed in an upper surface of the magnet holder 18 and thereafter pins 22 erected on the upper surface of the magnet holder 18 are inserted into guide holes 23 formed in the needle holder 20. Next, using tweezers or the like, the needles 16 are inserted one by one into the through holes 19 of the needle holder 20. By so doing, rear ends of the plural needles 16 are attracted by the permanent magnet 17 and come into close contact with the upper surface of the permanent magnet; besides, the needles 16 are controlled to a vertical attitude by the needle holder 20, so that their tips projecting from an upper surface of the needle holder 20 become equal in height.

The number of the needles 16 to be inserted into the through holes 19 of the needle holder 20 is increased or decreased in accordance with the size of each of the chips to be picked up. More specifically, in the case where the size of each chip 1 is large (FIG. 14(a)), the number of the needles 16 is increased, while in the case where the chip size is small (FIG. 14(b)), the number of the needles 16 is decreased. In both cases, the number of the needles 16 is adjusted so that the position of the outermost periphery portion of the plural needles 16 nearly overlaps the outermost periphery portion of the chips 1. It is preferable that the spacing between adjacent needles 16 be as narrow as possible. If the spacing between adjacent needles 16 is wide, the interface between the dicing tape 5 and the die attach film 4 does not peel off uniformly throughout the whole surface of each chip 1 at the time of picking up the chip. Particularly in the case of a thin chip 1, there is a fear of occurrence of cracking or chipping.

Since the pickup unit 15 adopts a method wherein the needles 16 made of a magnetic material are inserted into the through holes 19 and are fixed by the permanent magnet, it is characteristic in that the spacing between adjacent needles 16 can be made very narrow. In contrast therewith, in case of adopting a method wherein the rear ends of the needles 16 are fixed by clamping with screws or the like, the spacing between adjacent needles 16 becomes wide because the screw diameter is larger than the diameter of each needle 16.

The pickup unit 15 is further characteristic in that plural types of chips 1 different in size can be picked up by only changing the number of the needles 16 to be inserted into the through holes 19 of the needle holder 20. Thus, it is not necessary to provide plural types of pickup units according to chip sizes and therefore it is possible to reduce the cost of the pickup device. Further, since the number of the needles 16 to be inserted into the through holes 19 can be changed in a short time by merely pulling out and inserting the needles 16, the pickup operation can be done quickly even in such a manufacturing line as includes plural types of chips 1 different in size.

For picking up each chip 1 on the dicing tape 5 established its position in the pickup device 10, first ultraviolet light is radiated to the dicing tape 5. As a result, the pressure-sensitive adhesive applied to the dicing tape 5 cures and its tackiness is deteriorated. Consequently, the interface between the dicing tape 5 and the die attach film 4 becomes easier to peel off.

Figure 15:
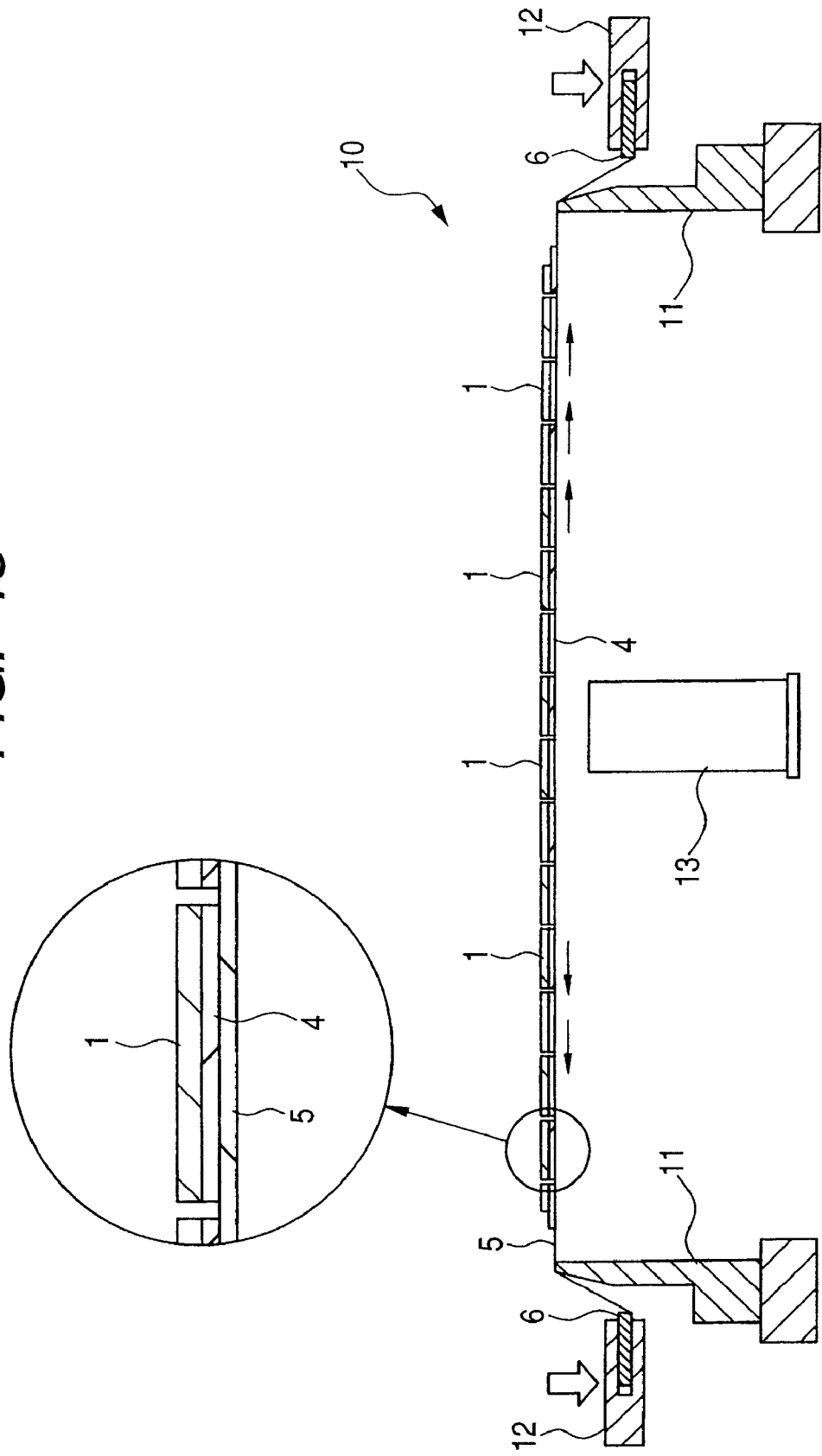
FIG. 15 is a side view showing a chip pickup step.

Next, as shown in FIG. 15, the expand ring 12 of the pickup device 10 is brought down to push down the wafer ring 6 bonded to the outer periphery portion of the dicing tape 5. As a result, the dicing tape 5 undergoes a strong tensile force acting from the center toward the outer periphery portion of the dicing tape and is stretched horizontally without looseness. Consequently, the die attach film 4 is also stretched at the same time. As noted earlier, since the chip-to-chip region of the die attach film 4 is half-cut in the dicing step for the wafer 1A, the stretched die attach film 4 is cut in this region and is separated chip by chip.

For cutting and separating the die attach film 4 it is preferable that the expand ring 12 be brought down at high speed and in a considerable amount to stretch the dicing tape 5 rapidly. In this embodiment, the expand ring 12 is brought down 10 mm or more at a speed of, say, 10 mm/sec though depending on the type of the dicing tape 5 and the die attach film 4.

Next, for diminishing the horizontal tensile force exerted on the dicing tape 5, the expand ring 12 is raised slightly at low speed. The rising speed and amount are, for example, lower than 10 mm/sec and about 3 mm or less, respectively. Subsequently, where required, the expand ring 12 may be brought down for example at a low speed of lower than 10 mm/sec and in an amount of about 3 mm or less and fine adjustment may be made until the magnitude of the horizontal tensile force exerted on the dicing tape 5 reaches a level best suited to the pickup of each chip 1.

Figure 16:
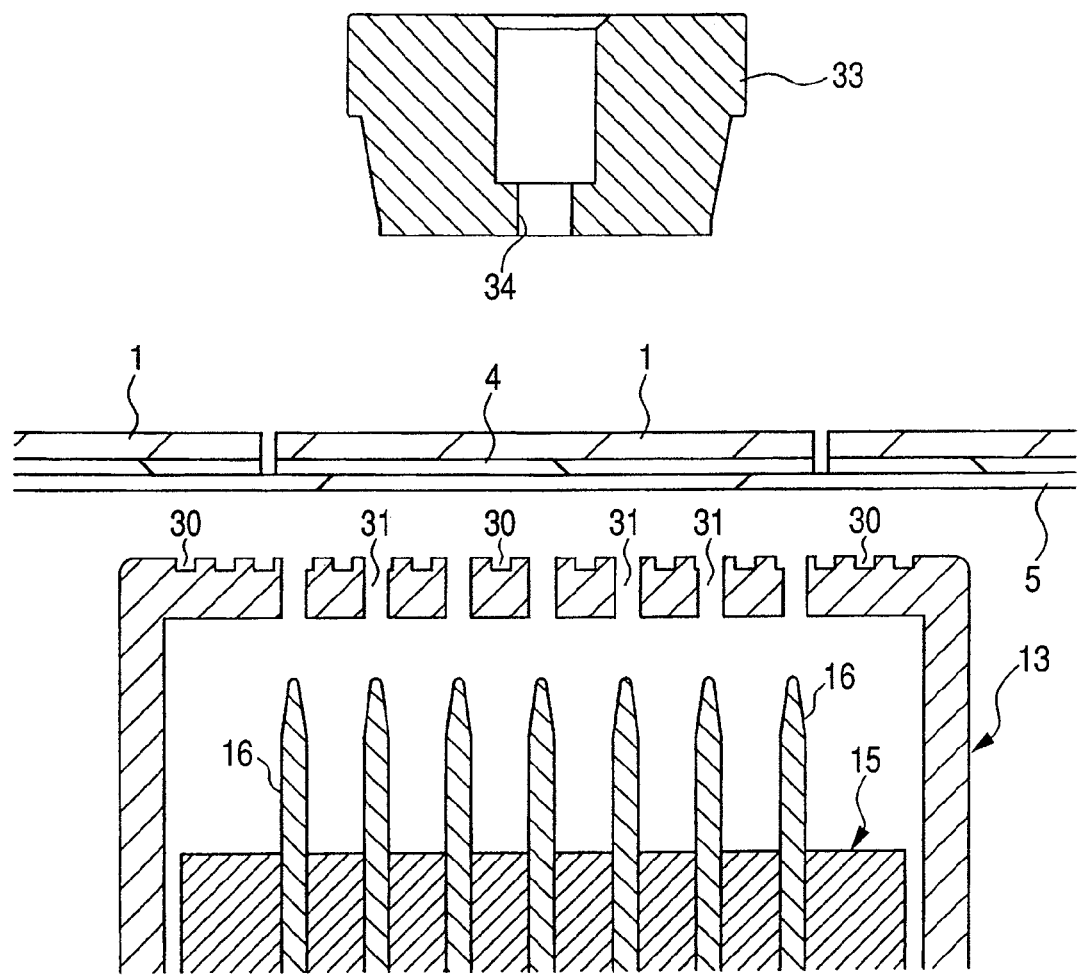
FIG. 16 is a sectional view showing the chip pickup step.
Figure 17:
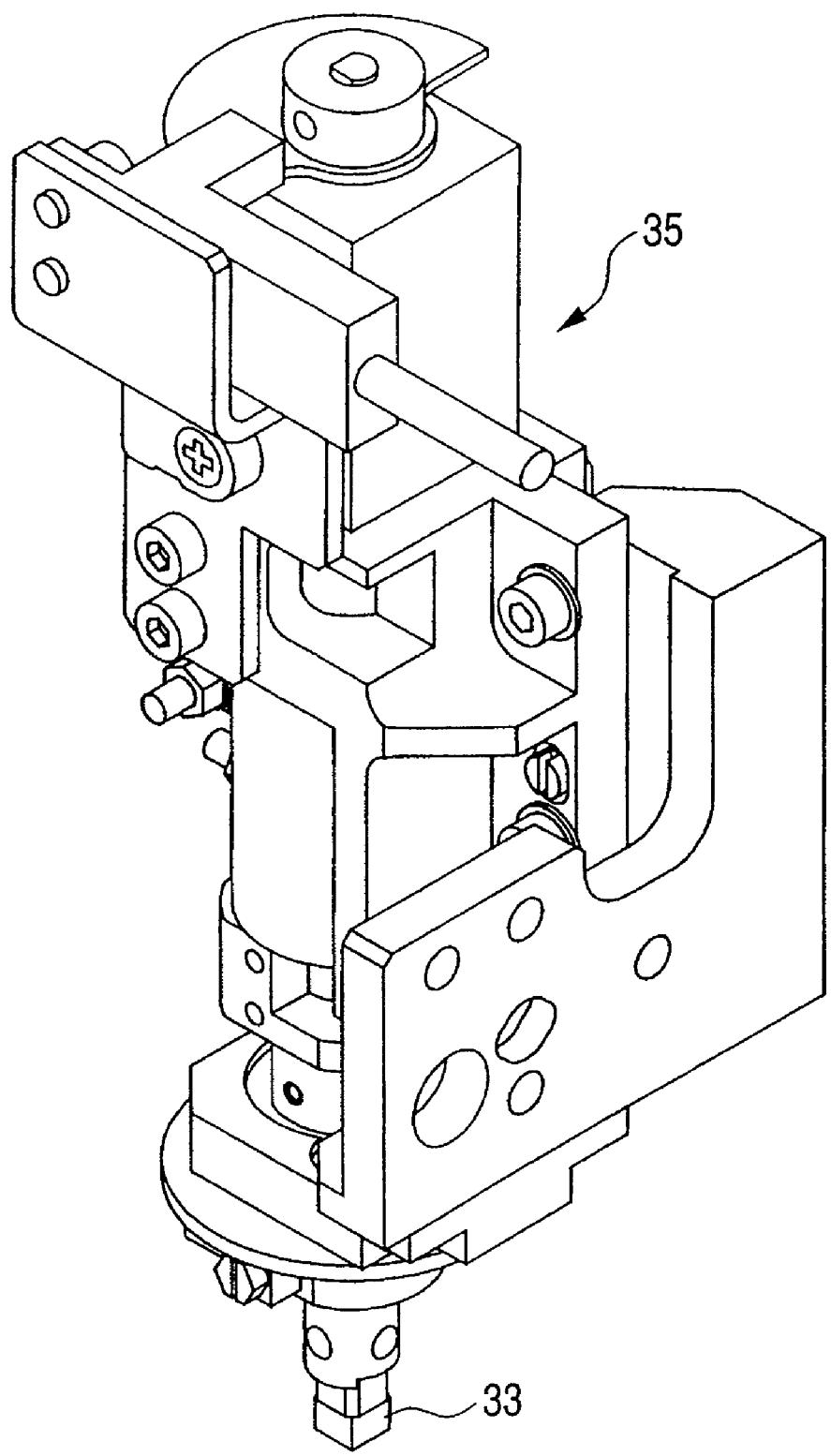
FIG. 17 is a perspective view showing an appearance of a collet drive unit with a chucking collet loaded thereto.

Next, as shown in FIG. 16, the chucking element 13 is moved to just under the chip 1 to be peeled off and a chucking collet 33 is moved to above the chip 1. A chucking hole 34 capable of being pressure-reduced in the interior thereof is formed centrally of the chucking collet 33 so that only one chip 1 to be peeled off can be chucked and held selectively. As shown in FIG. 17, the chucking collet 33 is attached to a lower end of a collet drive unit 35. The collet drive unit 35 is supported movably in both horizontal and vertical directions by a moving mechanism (not shown).

Figure 18:
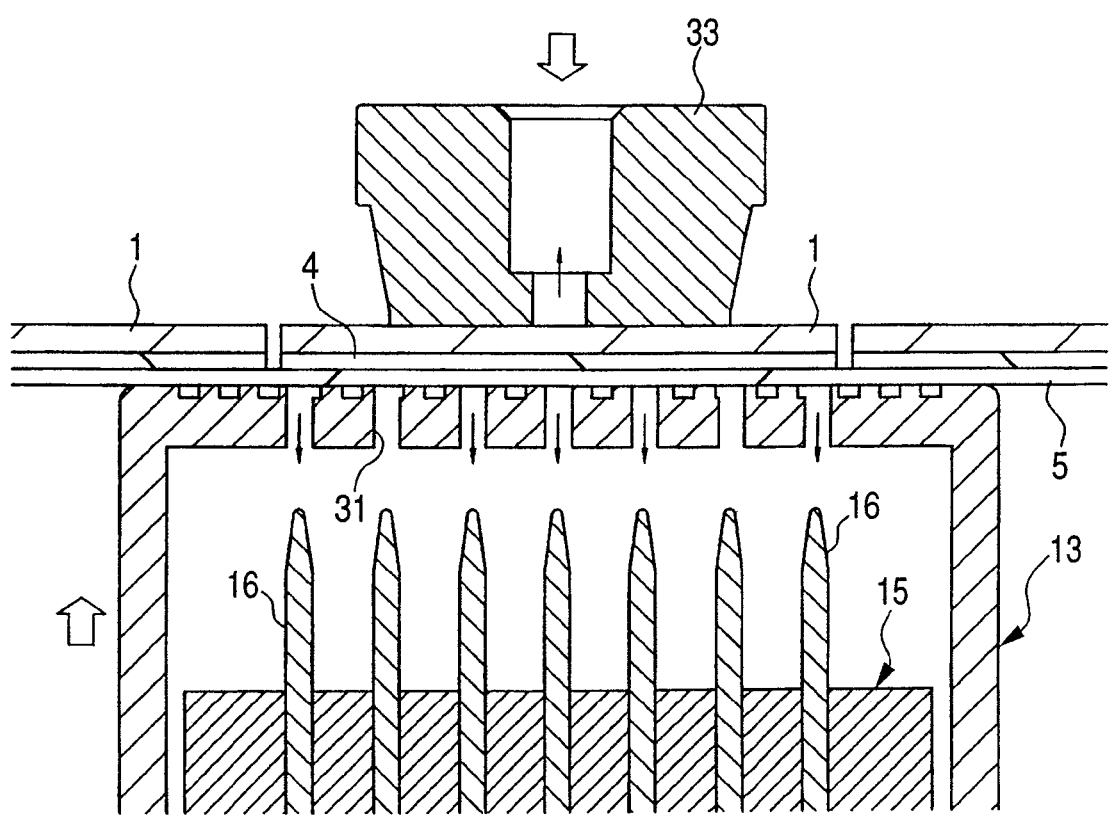
FIG. 18 is a sectional view showing the chip pickup step.

Next, as shown in FIG. 18, the chucking element 13 is raised, causing its upper surface to come into contact with the back surface of the dicing tape 5, and at the same time the internal pressure of the chucking element 13 is reduced. As a result, the dicing tape 5 positioned under the chip 1 to be peeled off comes into close contact with the upper surface of the chucking element 13. At the same time, the chucking collet 33 is brought down, causing its bottom to come into contact with an upper surface of the chip 1, the internal pressure of the chucking port 34 is reduced. As a result, the chip 1 to be peeled off comes into close contact with the bottom of the chucking collet 33.

Figure 19:
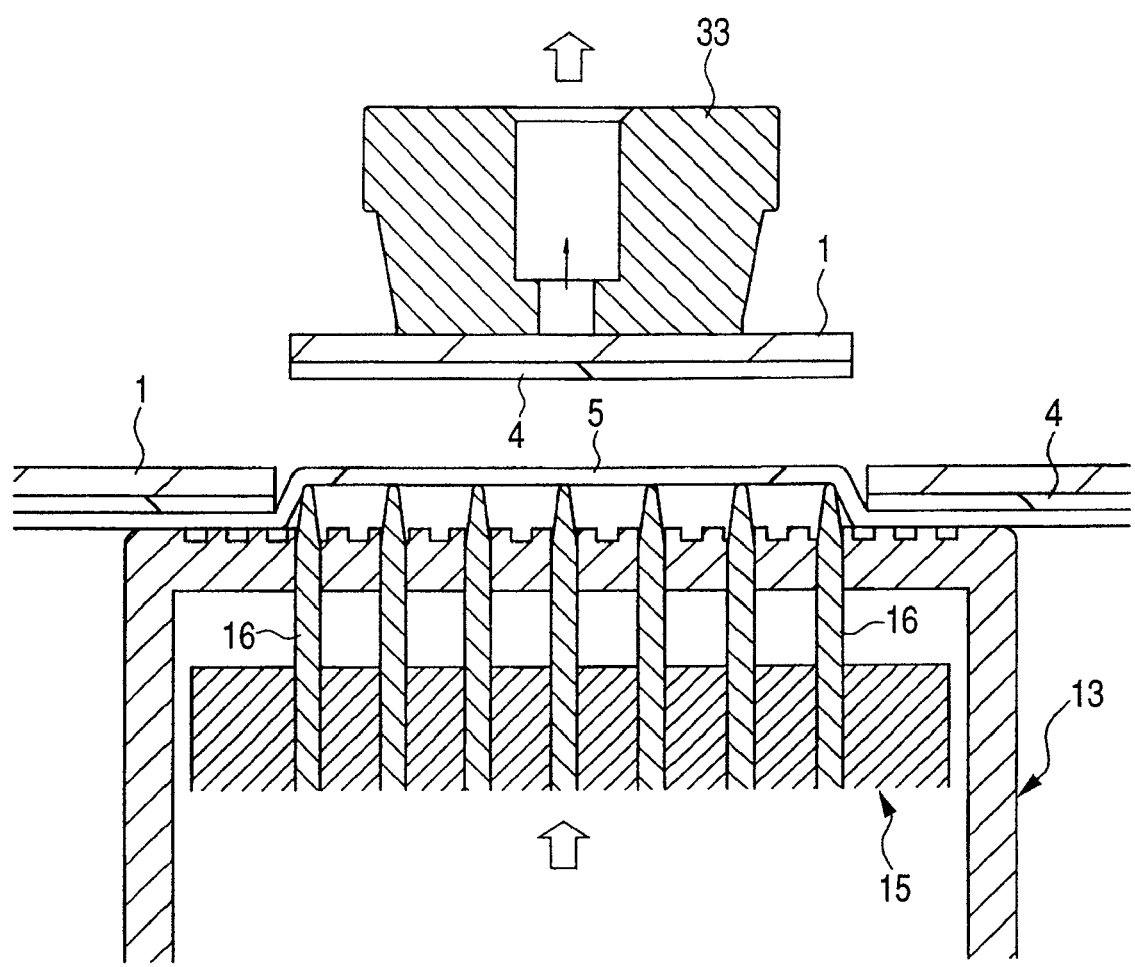
FIG. 19 is a sectional view showing the chip pickup step.

Next, as shown in FIG. 19, the pickup unit 15 installed within the chucking element 13 is raised to stick up the tips of the needles 16 from the upper surface of the chucking element 13, thereby pushing up the dicing tape 5. At the same time, the chucking collet 33 is pulled up, whereby the chip 1 is separated from the dicing tape 5 and is pulled up by the chucking collet 33.

If a strong horizontal tension is exerted on the dicing tape 5 when pushing up the dicing tape by the tips of the needles 16 of the pickup unit 15, the dicing tape which underlies the chip adjacent to the chip 1 to be peeled off is also pushed up simultaneously and thus there is a fear that the chip 1 other than the chip to be peeled off may also be separated from the dicing tape 5. In this embodiment, however, as noted previously, the horizontal tensile force exerted on the dicing tape 5 is set beforehand to a magnitude best suited to the pickup operation and thus there is no fear of separation of any other chip 1 than the chip 1 to be peeled off from the dicing tape 5.

When pushing up the dicing tape 5 by the tips of the needles 16, if the spacing between adjacent needles 16 is wide, the interface between the dicing tape 5 and the die attach film 4 no longer peels off uniformly throughout the whole surface of the chip 1 to be peeled off. Therefore, particularly in the case of a thin chip 1, there is a fear of occurrence of cracking or chipping. In this embodiment, however, as noted earlier, the dicing tape 5 and the die attach film 4 can be separated from each other uniformly because the spacing between adjacent needles 16 in the pickup unit 15 used in this embodiment is extremely narrow.

Figure 20:
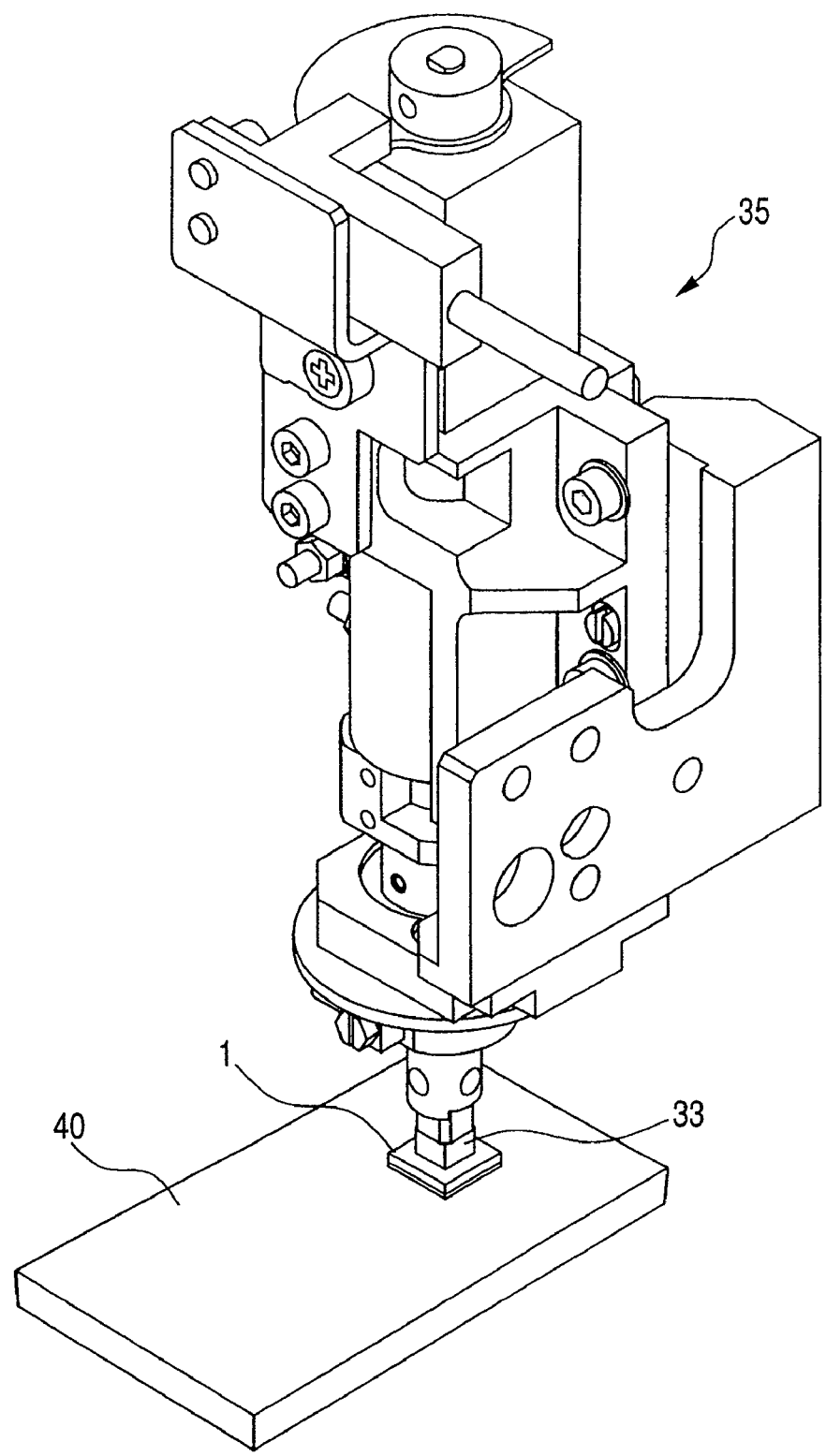
FIG. 20 is a perspective view showing a pellet bonding step for each chip.
Figure 21:
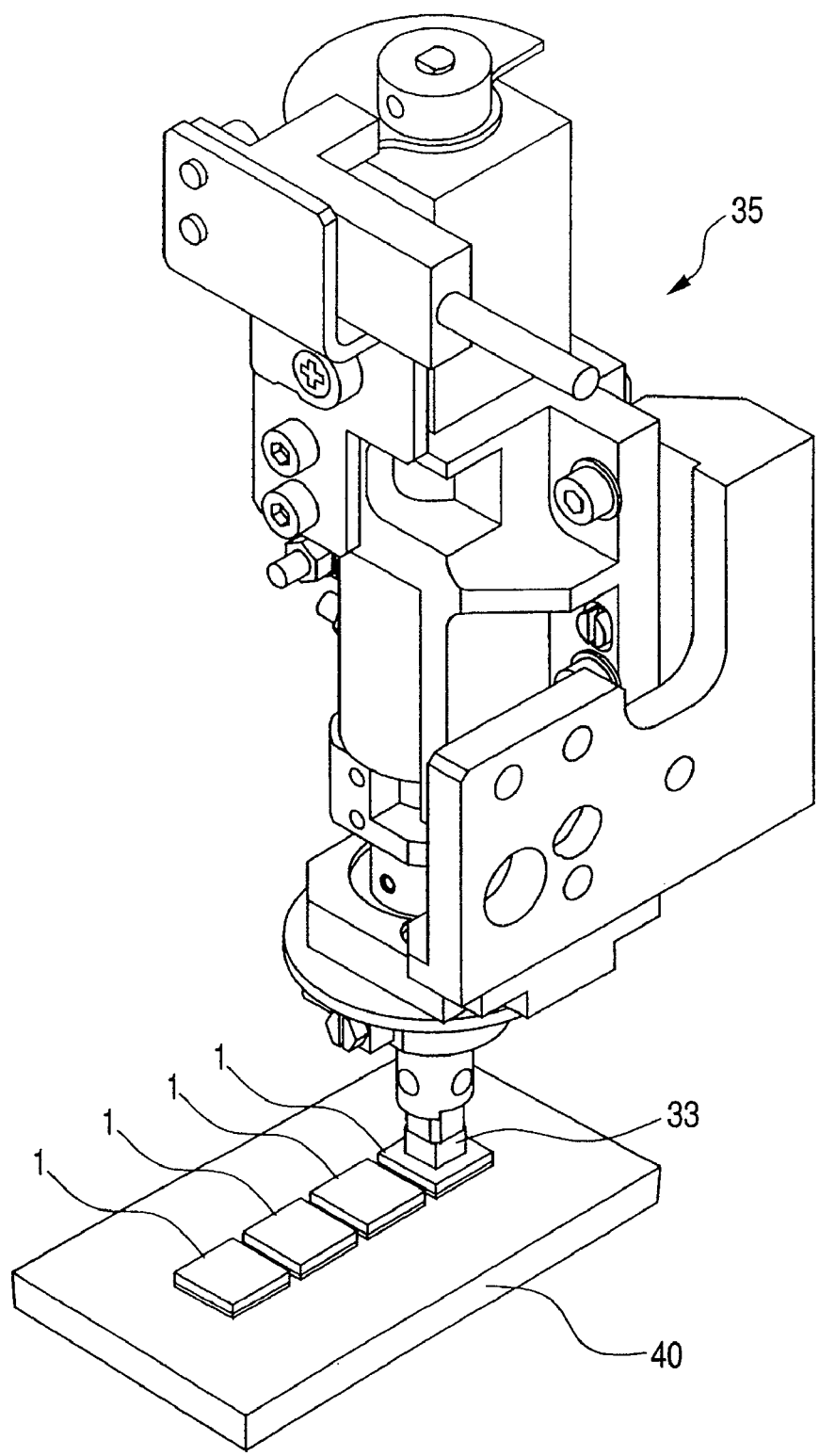
FIG. 21 is a perspective view showing the pellet bonding step for chips.

Then, with the collet drive unit 35, the chip 1 thus separated from the dicing tape 5 is conveyed to the next step (pellet bonding step) while being chucked by the chucking collet 33. As shown in FIG. 20, the chip 1 thus conveyed to the pellet bonding step is mounted onto a mounting base such as wiring substrate 40. When the collet drive unit 35 returns again to the pickup device 10, the next chip 1 is separated from the dicing tape 5 and is mounted onto the wiring substrate 40 in accordance with the foregoing procedure. Subsequently, in accordance with the same procedure, a predetermined number of chips 1 are separated one by one from the dicing tape 5 and are mounted onto the wiring substrate 40 (FIG. 21). Thereafter, the wiring substrate 40 is heated, allowing the die attach film 4 bonded to the back surfaces of the chips 1 to cure thermally. The pellet bonding step is now over.

Figure 22:
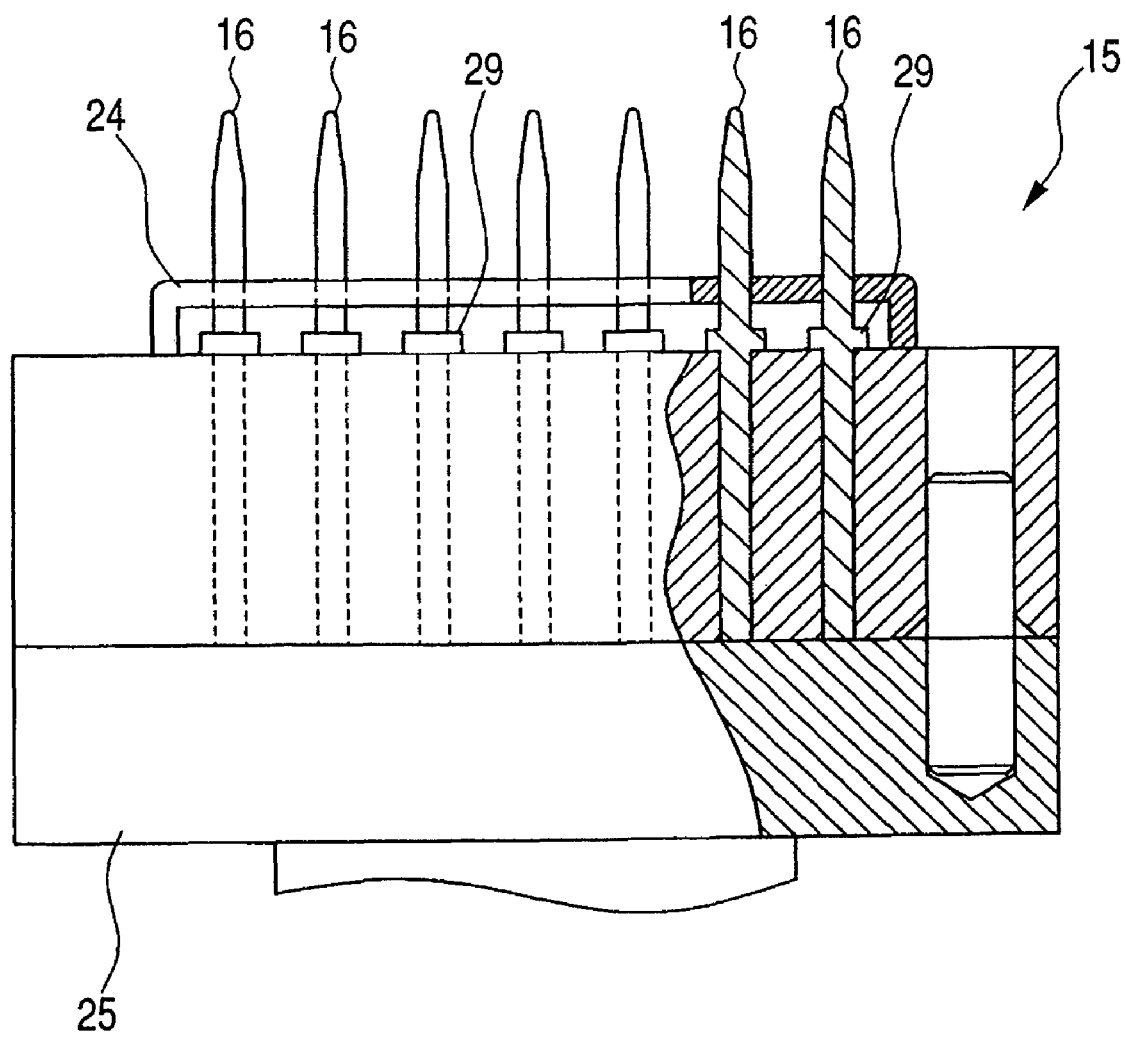
FIG. 22 is a partially broken-away sectional view of a pickup unit, showing another example of a needle fixing method.
Figure 23:
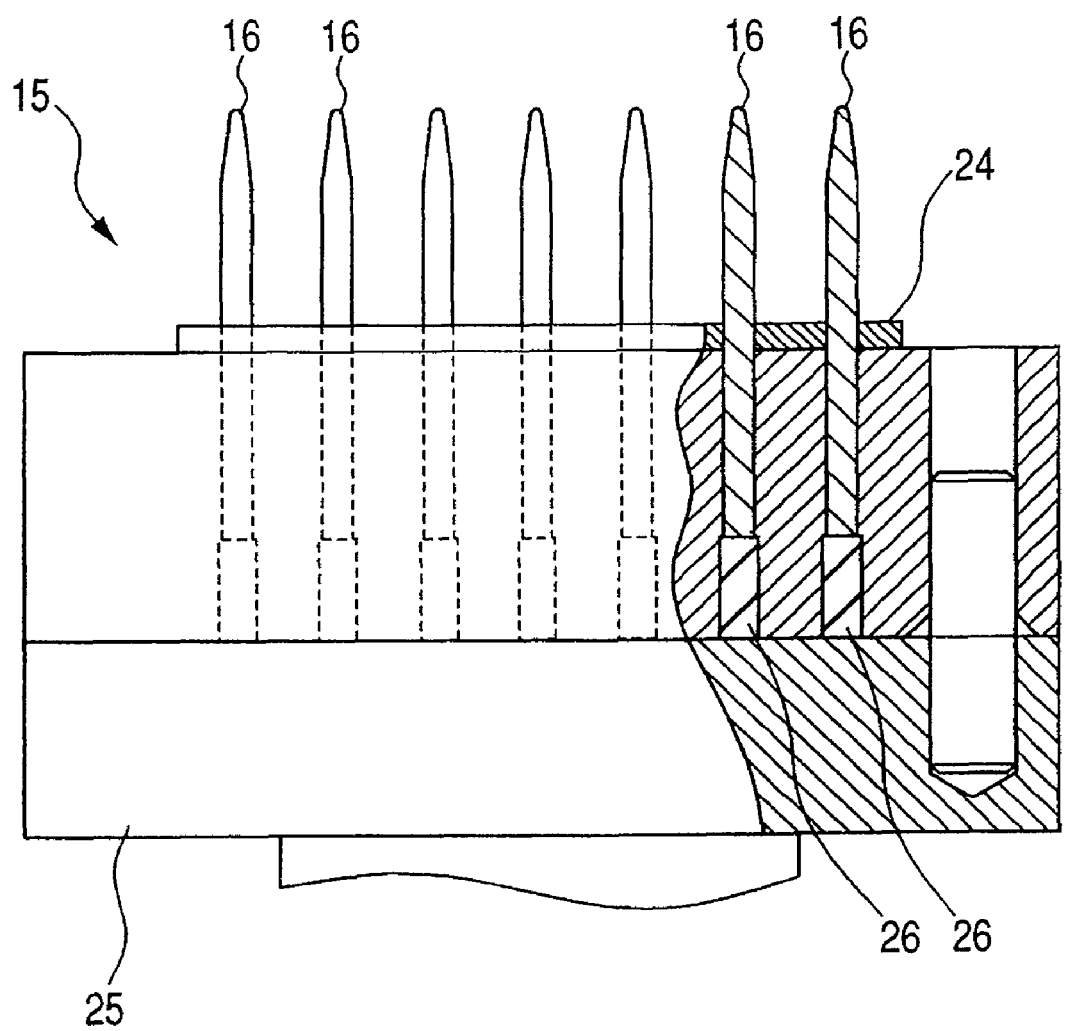
FIG. 23 is a partially broken-away sectional view of the pickup unit, showing a further example of a needle fixing method.

In the pickup unit 15 shown in FIGS. 12 and 13 the rear ends of the needles 16 made of a magnetic material and inserted into the through holes 19 of the needle holder 20 are fixed by the permanent magnet 17. In this case, if magnetism is imparted also to the needle holder 20, it is possible to hold the needles 16 in a more positive manner. Further, for example as shown in FIG. 22, a wide flange 29 may be formed in an intermediate portion of each needle 16 to restrict the height of the needle and a presser plate 24 may be fixed to the upper surface of the needle holder 20, allowing each needle 16 to be held by both presser plate 24 and needle holder 20. The presser plate 24 is fixed to the needle holder with screws or the like, but may be fixed to the needle holder 20 by being magnetized. In this case, if magnetism is imparted also to a holder 25 which supports the rear ends of the needles 16, the needles 16 can be held in a more positive manner. In the case where magnetism is imparted to both holder and presser plate 24, it is possible to suppress the deterioration of coercive forces of the two. For example, as shown in FIG. 23, the rear ends of the needles 16 may be supported by thin rubber tubes 26 erected on an upper surface of the holder 25. Also in this case, if the presser plate 24 is fixed to the upper surface of the needle holder 20 or if magnetism is imparted to the presser plate 24, it is possible to hold the needles 16 in a more positive manner.

Figure 24:
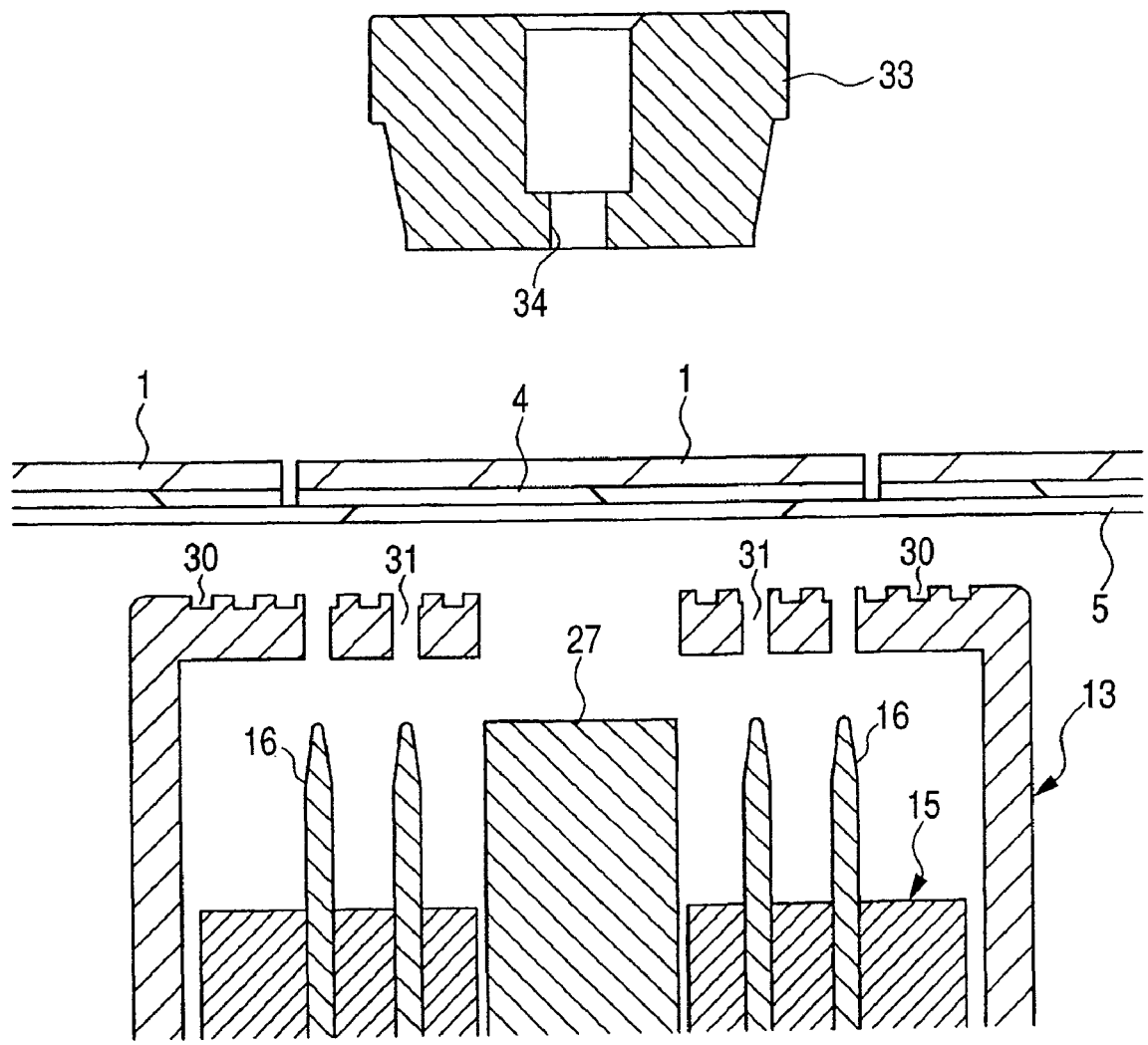
FIG. 24 is a sectional view showing another example of a chip pickup method.

Although in this embodiment each chip 1 is stuck up using plural needles 16 loaded to the pickup unit 15, there may be adopted, for example, such a method as shown in FIG. 24 wherein each chip 1 is stuck up in two steps using plural needles 16 and a stick-up block 27 disposed inside the needles. This method is effective particularly in the case where the adhesion between the dicing tape 4 and the die attach film 4 is strong or in the case where the size of each chip 1 is large.

The block 27 is constituted by a columnar member larger in diameter than each needle 16 and a flat upper surface thereof comes into surface contact with the back surface of the dicing tape 5. The needles 16 and the block 27 are vertically movable independently of each other, and in a stand-by condition the tips of the needles 16 and the upper surface of the block 27 are flush with each other. Also in this case, the number of needles 16 is increased when the size of the chip 1 to be peeled off is large and it is decreased when the chip size is small.

Figure 25:
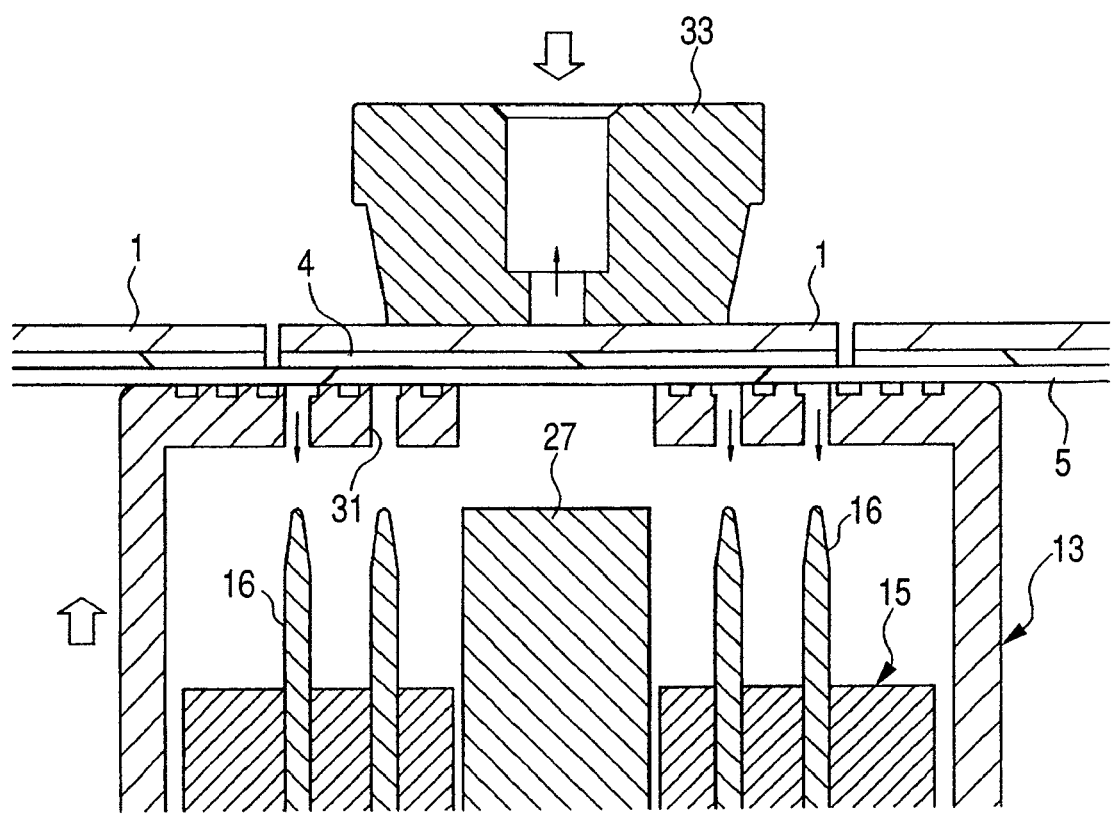
FIG. 25 is a sectional view showing the another example of the chip pickup method.

For sticking up each chip 1 with use of the needles 16 and the block 27, the chucking element 13 is raised to bring its upper surface into contact with the back surface of the dicing tape 5, as shown in FIG. 25, and the internal pressure of the chucking element 13 is reduced. As a result, the dicing tape 5 which underlies the chip 1 to be peeled off comes into close contact with the upper surface of the chucking element 13. At the same time, the chucking collet 33 is brought down, causing its bottom to come into contact with the upper surface of the chip 1, and the internal pressure of the chucking port 34 is reduced, with the result that the chip 1 to be peeled off comes into close contact with the bottom of the chucking collet 33.

Figure 26:
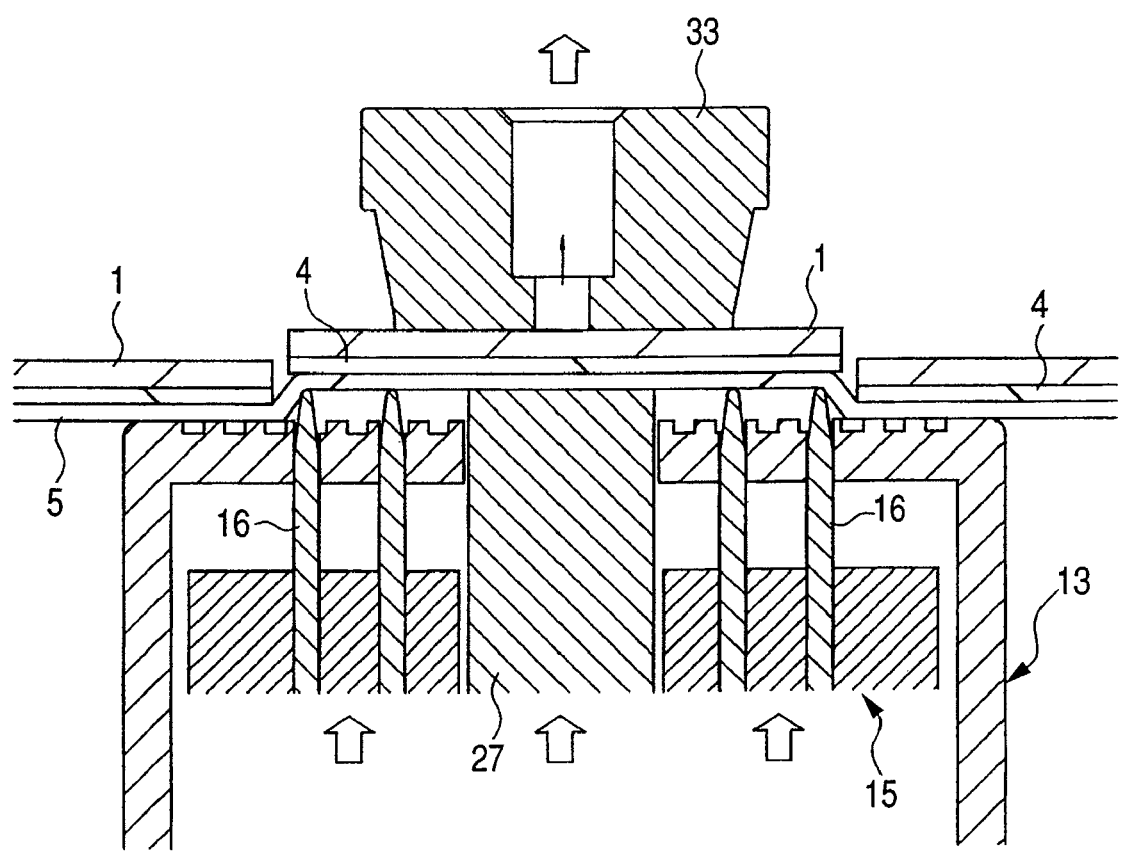
FIG. 26 is a sectional view showing the another example of the chip pickup method.

Next, as shown in FIG. 26, the pickup unit 15 installed within the chucking element 13 is raised and the tips of the needles 16 and the upper surface of the block 27 are stuck up simultaneously from the upper surface of the chucking element 13, thereby pushing up the dicing tape 5. The chip 1 peels off from the dicing tape 5 if the adhesion between the dicing tape 5 and the die attach film 4 is weak or if the size of the chip 1 is small, so all that is required is pulling up the chucking collet 13 simultaneously with the stick-up motion.

Figure 27:
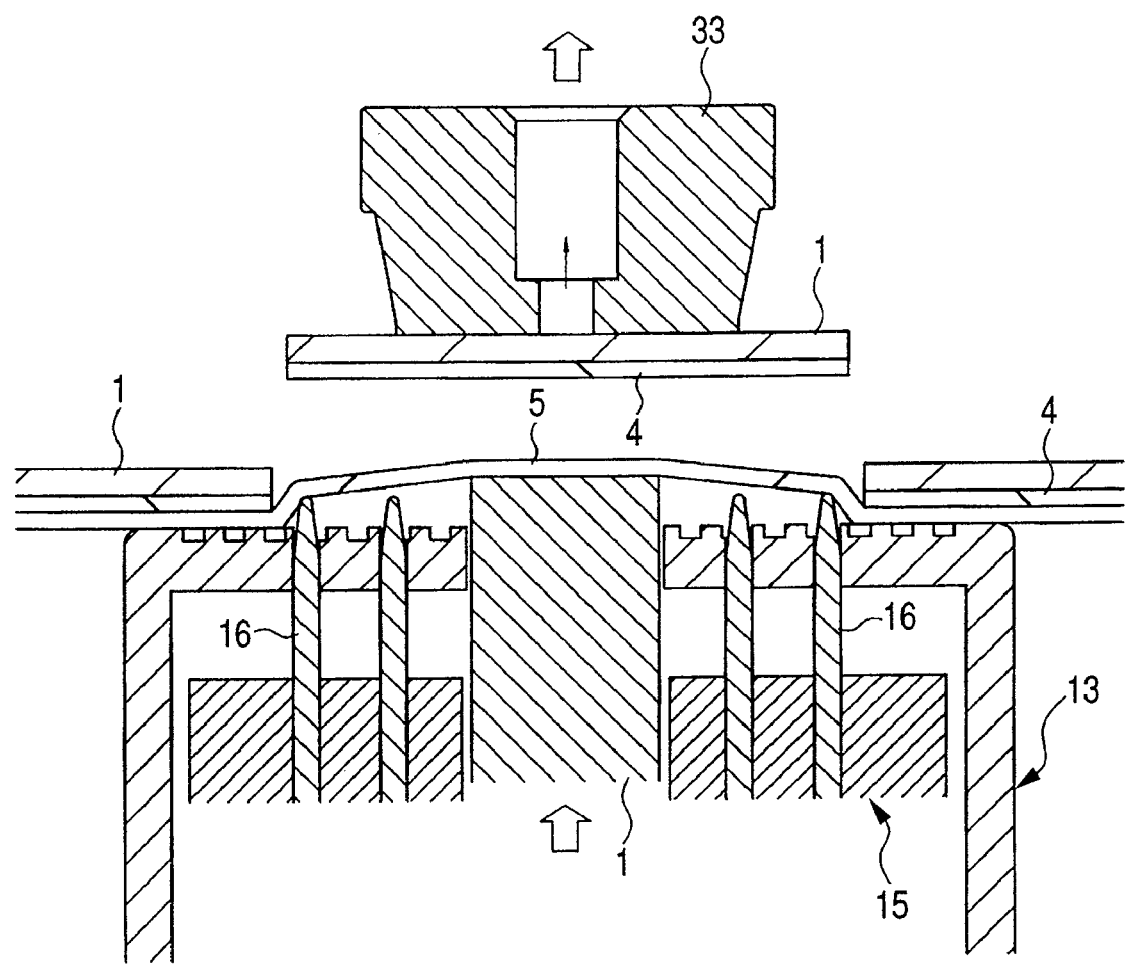
FIG. 27 is a sectional view showing a further example of a chip pickup method.

On the other hand, if the adhesion between the dicing tape 5 and the die attach film 4 is strong or if the size of the chip 1 is large, only the peripheral portion of the chip 1 separates from the dicing tape 5 and the central portion thereof does not peel off. In this case, only the upper surface of the block 27 is further stuck up as shown in FIG. 27. By so doing, the peeling of the dicing tape 5 proceeds from the peripheral portion toward the central portion of the chip 1, so that by pulling up the chucking collet 33 the chip 1 peels off completely from the dicing tape 5 and is pulled up.

Figure 28:
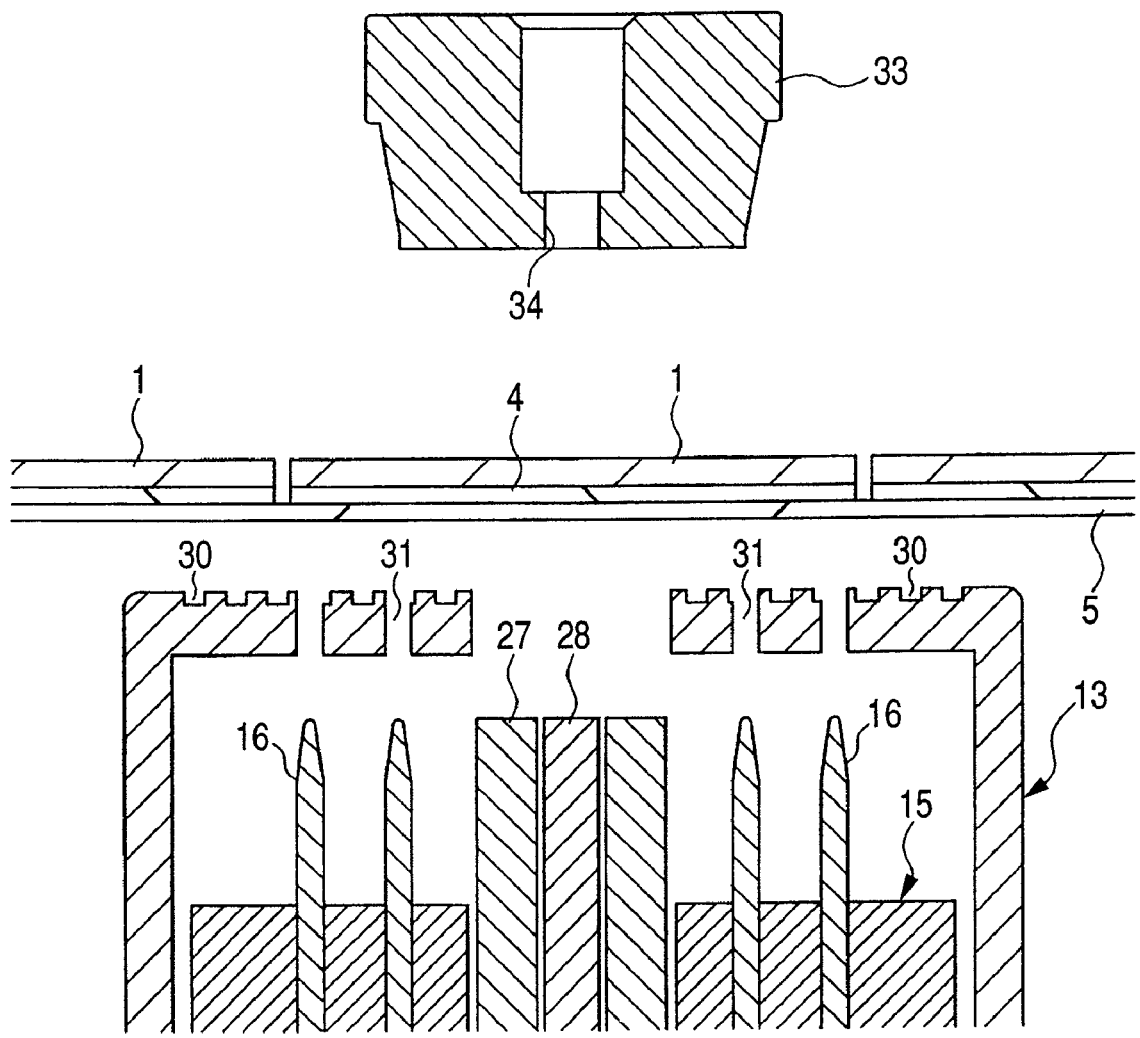
FIG. 28 is a sectional view showing a still further example of a chip pickup method.

The number of the block 27 is not limited to one, but plural blocks of a small diameter may be combined. Or, there may be adopted such a configuration as shown in FIG. 28 in which the central portion of a small-diameter block 27 is formed hollowly and a block 28 of a smaller diameter is disposed within the hollow portion in such a manner that the two blocks 27 and 28 can vertically move independently of each other. In this case there may be adopted a three-step stick-up method wherein first plural needles 16 and the two blocks 27, 28 are stuck up simultaneously, then only the two blocks 27 and 28 are further stuck up, and thereafter only the central block 28 is further stuck up.

For example, of the plural needles 16 attached to the pickup unit 15, plural needles 16 which are in contact with the peripheral portion of the chip 1 and plural needles 16 which are in contact with the central portion of the chip 1 may moved vertically and independently of each other, whereby the foregoing two- or three-step pickup operation can be effected with only plural needles 16.

The above two- or three-step pickup method is also applicable to a pellet bonding method not using the die attach film 4, i.e., to the case where each chip 1 bonded directly to the surface of the dicing tape 5 is picked up and conveyed to the pellet bonding step and is thereafter bonded onto the mounting base through an adhesive (paste) which has been applied beforehand onto the mounting base with use of a paste applicator. In this case, the chip 1 can be separated quickly from the dicing tape 5 also by adopting a method wherein an ultrasonic wave oscillator is attached to the pickup unit 15 and oscillating needles 16 and blocks 27, 28 are stuck up under ultrasonic oscillation.

Second Embodiment

In the previous first embodiment a description was directed mainly to the die bonding method for chips 1 with use of the die attach film 4, while in this second embodiment a description will be given about a die bonding method for chips 1 with use of paste.

Figure 29:
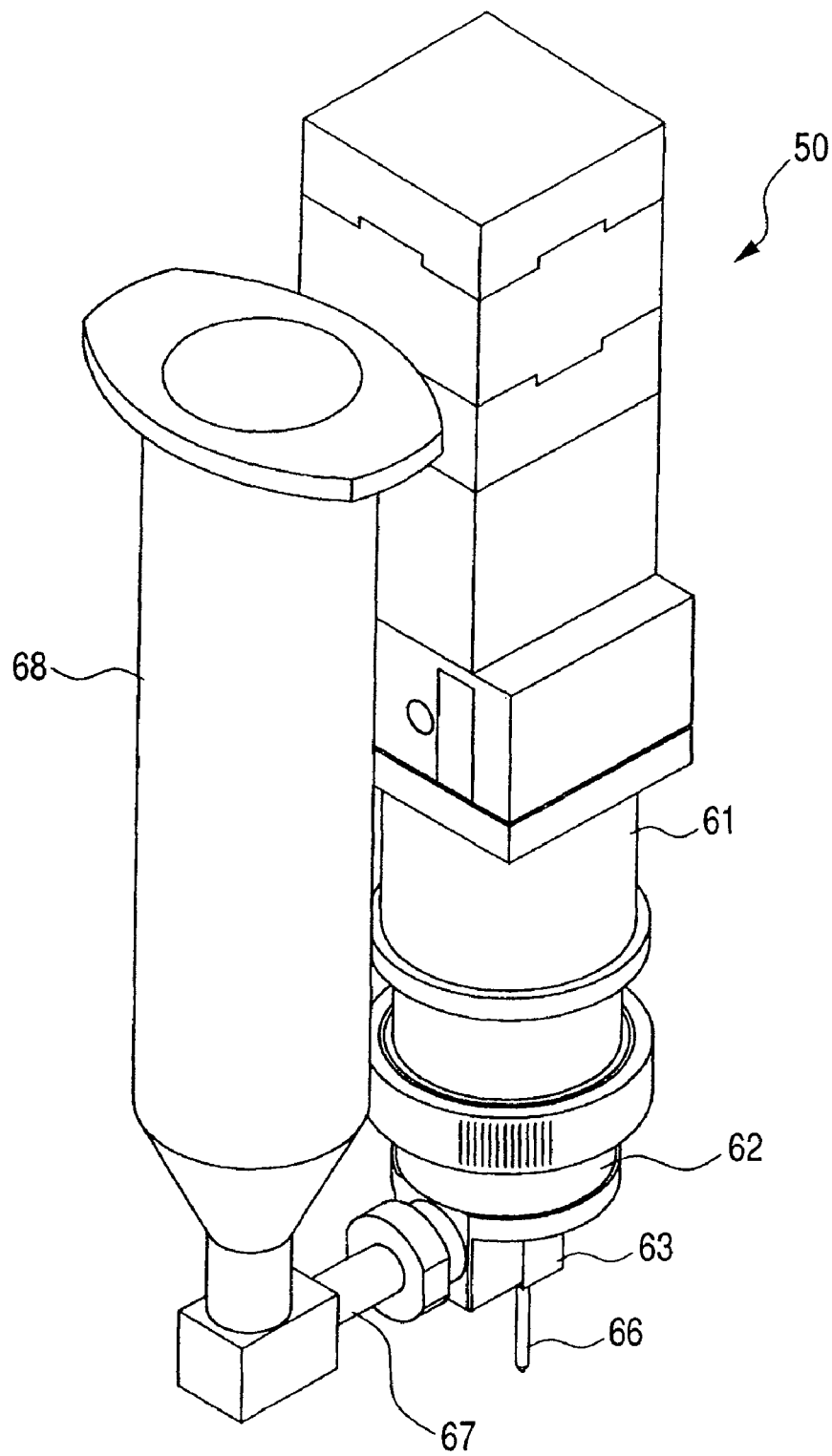
FIG. 29 is a perspective view showing an appearance of a dispenser.
Figure 30:
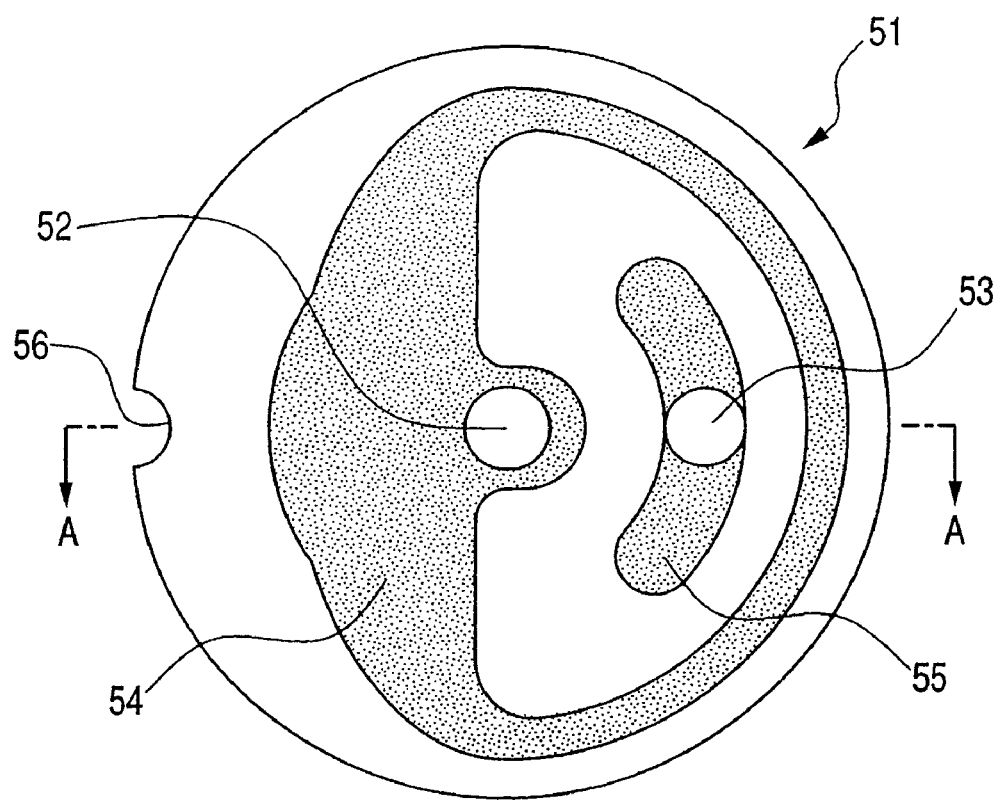
FIG. 30 is a plan view of a sealing disc as a mechanical part of the dispenser shown in FIG. 29.
Figure 31:
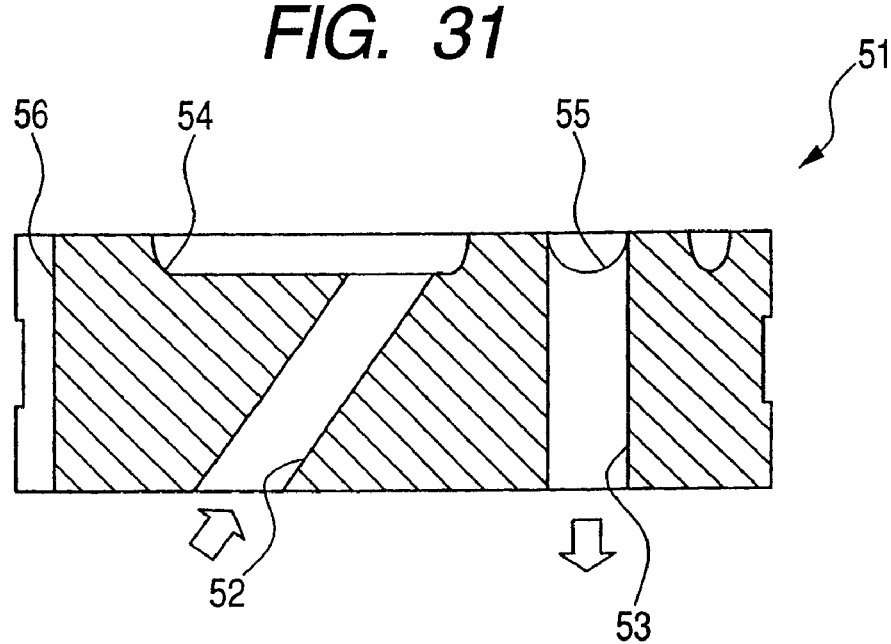
FIG. 31 is a sectional view taken along line A-A in FIG. 30.

FIG. 29 is a perspective view showing an appearance of a dispenser used in this second embodiment, FIG. 30 is a plan view of a sealing disc as a mechanical part of the dispenser, and FIG. 31 is a sectional view taken along line A-A in FIG. 30.

Figure 34:
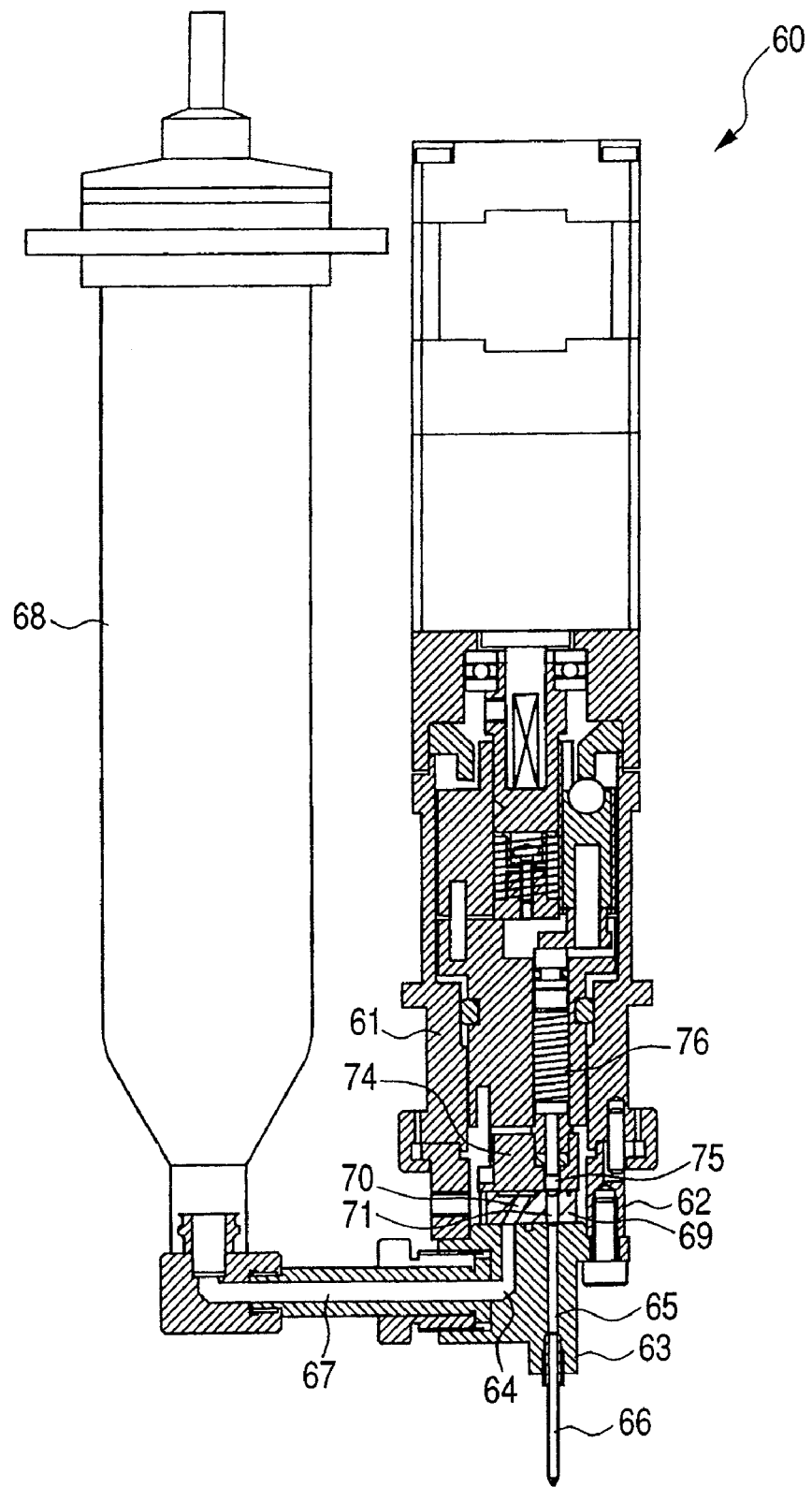
FIG. 34 is a sectional view showing a principal portion of a dispenser which the present inventors have studied.
Figure 35:
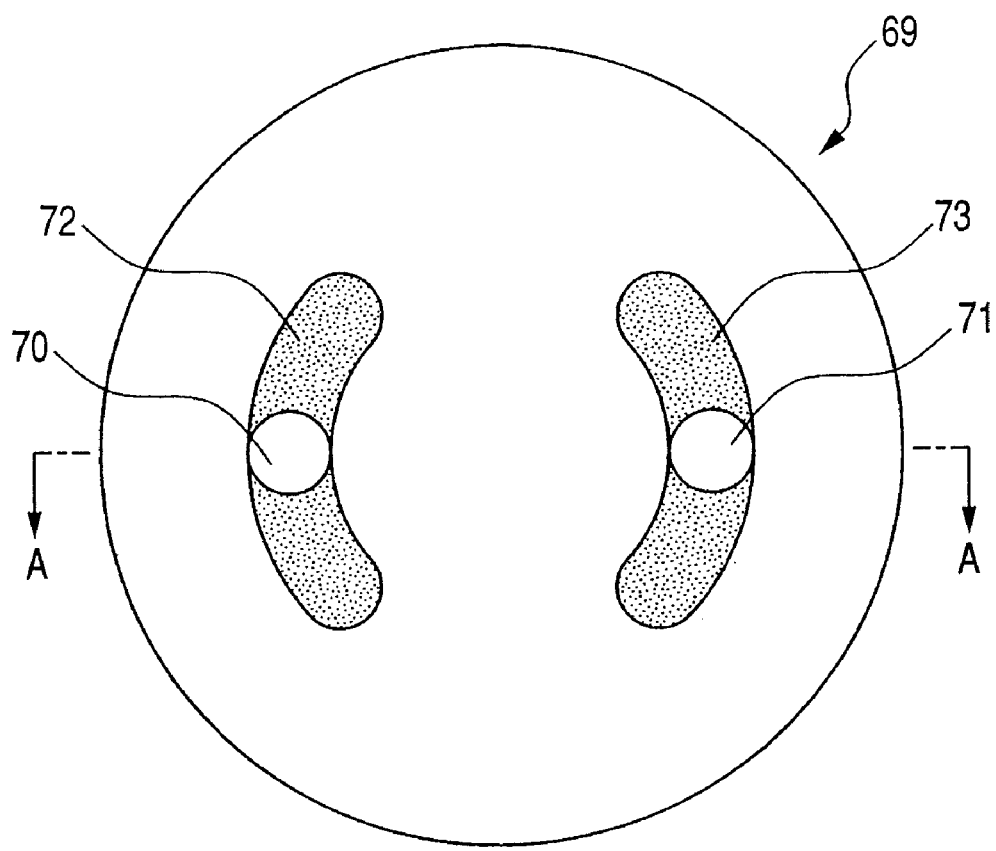
FIG. 35 is a plan view of a sealing disc as a mechanical part of the dispenser shown in FIG. 34.
Figure 36:
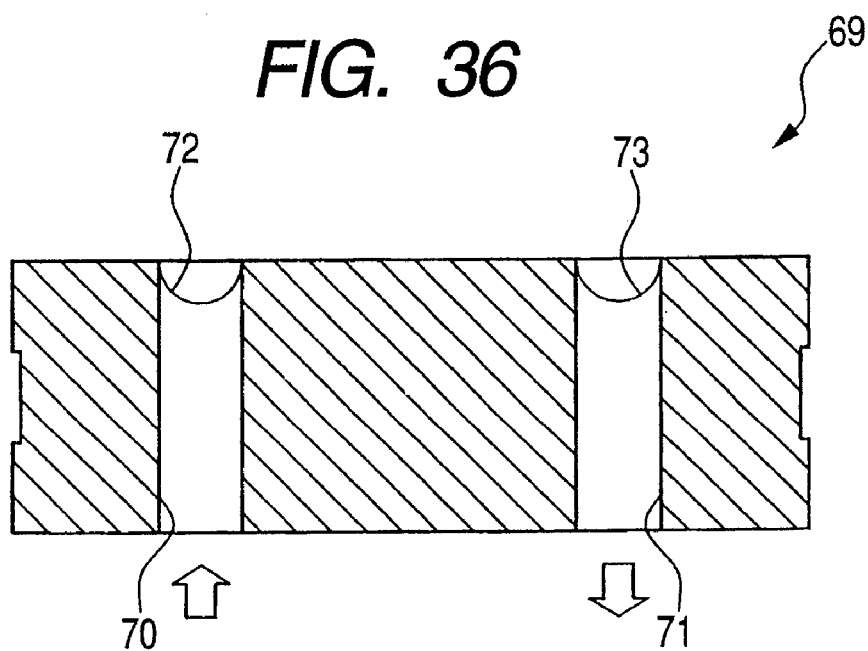
FIG. 36 is a sectional view taken along line A-A in FIG. 35.

In a dispenser 50 used in this second embodiment, only the structure of a sealing disc 51 is different from the dispenser 60 shown in the foregoing FIGS. 34 to 36. Therefore, other mechanical parts will be referred to using the same reference numerals as those of the mechanical parts of the dispenser 60.

As shown in FIGS. 30 and 31, a suction hole 52 which is put in communication with a suction port 64 and a discharge hole 53 which is put in communication with a discharge port 65 are formed in the interior of a cylindrical sealing disc 51. Further, a suction groove 54 connected to the suction hole 52 and a discharge groove 55 connected to the discharge hole 53 are formed in an upper surface of the sealing disc 51.

The position and shape of the discharge groove 55 are the same as those of the discharge groove 73 formed in the sealing disc 69 of the dispenser 60. On the other hand, the suction groove 54 is characterized by being formed in the upper surface of the sealing disc 51 so as to surround the entire periphery of the discharge groove 55.

As a result of the change in position and shape of the suction groove 54, the position of the suction hole 52 connected to the suction groove 54 is also changed in the upper surface of the sealing disc 51. The suction groove 54 is the widest near the suction hole 52 and is narrow in the region spaced away from the suction hole 52. The suction hole 52 is put in communication with the suction port 64 in a lower surface of the sealing disc 51 and therefore the position of the suction hole 52 in the lower surface of the sealing disc 51 is the same as the position of the discharge groove 73 formed in the sealing disc 69. Thus, as shown in FIG. 31, the suction hole 52 extends obliquely through the upper and lower surfaces of the sealing disc 51. On the other hand, the discharge hole 53 extends through the sealing disc 51 perpendicularly to both upper and lower surfaces of the sealing disc. It is not always necessary for the suction hole 52 to extend obliquely through the sealing disc 51. The suction hole 52 may be formed through and perpendicularly to both upper and lower surfaces of the sealing disc 51 in the portion positioned on the center side with respect to the discharge hole 53.

The sealing disc 51 is formed of a ceramic material to improve the flatness of its upper and lower surfaces. Particularly, the upper surface of the sealing disc 51 on which the lower surface of the valve disc 74 slides is formed to a flatness (difference in height between convex and concave portions) of not larger than 0.001 mm. Consequently, a portion of the paste present within the plunger inserting holes 75 and the discharge groove 55 is difficult to leak out onto the sliding surfaces, so that it is possible suppress wear of the sliding surfaces caused by a filler or the like contained in the paste.

Moreover, since the entire periphery of the discharge groove 55 is surrounded by the suction groove 54 in the upper surface of the sealing disc 51, even if a portion of the paste present within the plunger inserting holes 75 and the discharge groove 55 should leak out to the sliding surfaces, the leaking paste can be recovered into the suction groove 54 and therefore it is possible to prevent the occurrence of such an inconvenience as leaking-out of the paste to the exterior of the sliding surfaces.

Thus, since the leakage of the paste to the sliding surfaces of the valve disc 74 and the sealing disc 51 can be prevented by attaching the sealing disc 51 according to this embodiment to the dispenser 50, it is possible to prevent a change in the amount of the paste fed onto the mounting base. Besides, since the paste leaking out to the exterior of the sliding surfaces can be prevented from solidifying in the interior of the dispenser 50, it is possible to decrease the maintenance frequency of the dispenser 50. To further ensure the prevention of solidifying of the paste leaking out to the exterior of the sliding surfaces, an edge 56 may be formed in a side wall surfaces of the sealing disc 51 as shown in FIGS. 30 and 31 so that the paste leaking out to the sliding surfaces outside the suction groove 54 is recovered into the edge 56.

Figure 32:
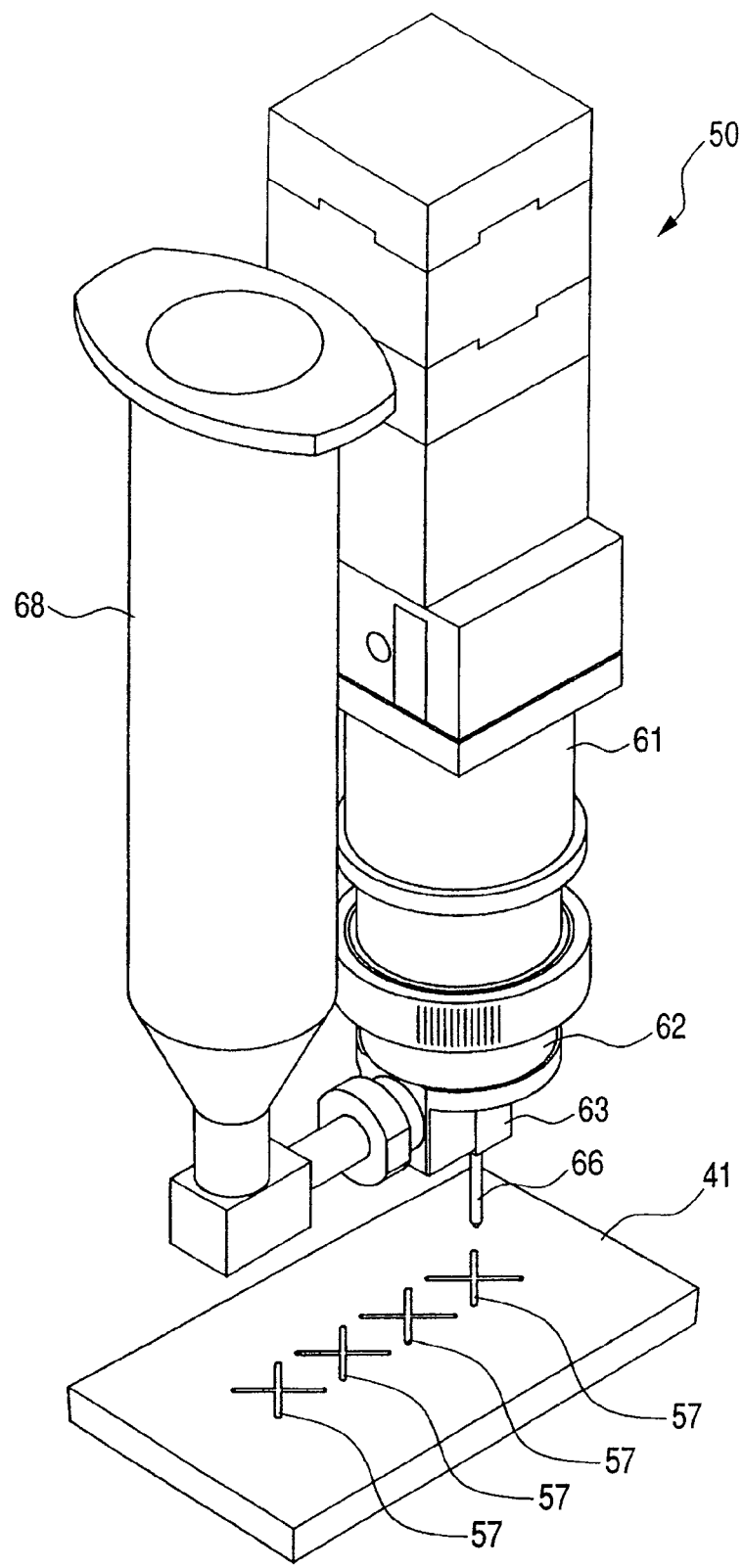
FIG. 32 is a perspective view showing a pellet bonding step for chips.
Figure 33:
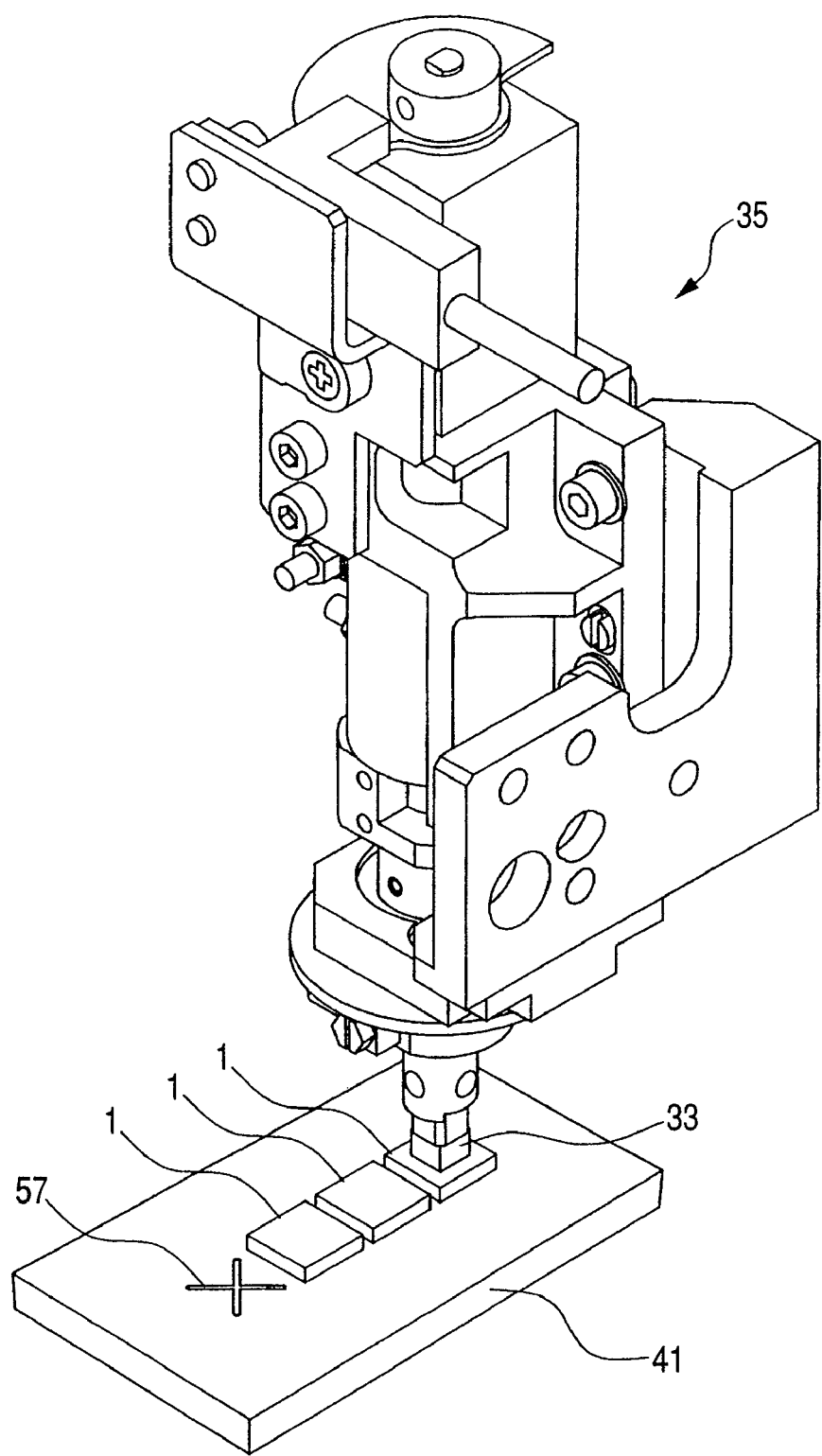
FIG. 33 is a perspective view showing the pellet bonding step for chips.

For pellet bonding of chips 1 onto a wiring substrate with use of a die bonding paste, first, as shown in FIG. 32, the paste, indicated at 57, is fed to a chip mounting region on the wiring substrate indicated at 41 by means of the dispenser 50. Next, as shown in FIG. 33, each chip 1 separated from the dicing tape is chucked and held by the chucking collet 33 in the collet drive unit 35 and is conveyed onto the wiring substrate 41, then is put on the paste 57. For separating the chip 1 from the dicing tape there is used, for example, the pickup device of the multi-step stick-up type which has been shown in FIGS. 24 to 28 in connection with the previous first embodiment.

Thereafter, the wiring substrate 41 is heated to cure the paste 57 thermally, whereby the pellet bonding step is completed.

Although the present invention has been described above by way of embodiments thereof, it goes without saying that the present invention is not limited to the above embodiments, but that various changes may be made within the scope not departing from the gist of the invention.

The pickup method described in the above embodiments, which involves stretching the dicing tape with a strong tensile force to cut and separate the die attach film, subsequently diminishing the tension imposed on the dicing tape and then picking up each chip, is applicable not only to the case where each chip is picked by sticking up the back surface of the dicing tape with needles or a block but also, for example, to the case where the chucking element is brought into contact with the back surface of the dicing tape to suck the dicing tape downward and each chip is picked up by the chucking collet.

Although in the above embodiments a description has been directed to the case where the present invention is applied to the die bonding of chips each formed thin to a thickness of about 30 to 60 μm, the present invention may be applied to the die bonding of thick chips each 60 μm or more in thickness.

The present invention is a technique applicable effectively to a die bonding step which is one step included in a semiconductor manufacturing process.

What is claimed is:

1. A method of manufacturing a semiconductor device comprising the steps of:
    (a) affixing a dicing film to a back surface of a semiconductor wafer;
    (b) after the step (a), dicing the semiconductor wafer to divide the semiconductor wafer into a plurality of semiconductor chips; and
    (c) after the step (b), sticking up a back surface of the dicing film by a stick-up means of a pickup means to suck the stuck-up semiconductor chips, thereby separating the semiconductor chips from the dicing film, the stick-up means comprising a pickup element and a pickup unit accommodated in an interior of the pickup element,
    the pickup unit comprising a plurality of needles having tips for contact with the back surface of the dicing film, a magnet for fixing rear ends of the plural needles, and a needle holder which includes a plurality of through holes each having an inside diameter slightly larger than the diameter of each of the needles and controls the attitude of the needles inserted respectively into the plural through holes, a length of the needle holder being shorter than a length of the needles, the pickup element having an upper surface including a plurality of openings for allowing the tips of the needles to project from the upper surface of the pickup element in the step (c), the back surface of the dicing film being pushed up by the tips of the needles in the step (c).

2. A method of manufacturing a semiconductor device according to claim 1, wherein the number of the needles attached to the pickup unit is increased or decreased in accordance with the size of each of the semiconductor chips.

3. A method of manufacturing a semiconductor device according to claim 1, wherein the needles are comprised of a magnetic material.

4. A method of manufacturing a semiconductor device according to claim 1, wherein the pickup unit is moved vertically in the interior of the pickup element in the step (c).

5. A method of manufacturing a semiconductor device according to claim 1, wherein the openings serve as suction holes.

6. A method of manufacturing a semiconductor device according to claim 1, wherein the number of the needles is less than the number of the through holes.

7. A method of manufacturing a semiconductor device according to claim 1, wherein a portion of the needles and the remaining portion of the needles are adapted to vertically move independently of each other.

8. A method of manufacturing a semiconductor device comprising the steps of:
   (a) affixing a dicing film to a back surface of a semiconductor wafer;
   (b) after the step (a), dicing the semiconductor wafer to divide the semiconductor wafer into a plurality of semiconductor chips; and
   (c) after the step (b), sticking up a back surface of the dicing film by a stick-up means of a pickup means to suck the stuck-up semiconductor chips, thereby separating the semiconductor chips from the dicing film, the stick-up means comprising a pickup element and a pickup unit accommodated in an interior of the pickup element,
      the pickup unit comprising a plurality of needles having tips for contact with the back surface of the dicing film, a magnet for fixing rear ends of the plural needles, and a needle holder which includes a plurality of through holes each having an inside diameter slightly larger than the diameter of each of the needles and controls the attitude of the needles inserted respectively into the plural through holes, a length of the needle holder being shorter than a length of the needles, the pickup element having an upper surface including a plurality of openings for allowing the tips of the needles to project from the upper surface of the pickup element in the step (c), the back surface of the dicing film being pushed up by the tips of the needles in the step (c),
      the step (c) comprising a first step of sticking up the back surface of the dicing film with the plural needles and a second step of further sticking up the back surface of the dicing film with a portion of the plural needles.

9. A method of manufacturing a semiconductor device according to claim 8, wherein the number of the needles attached to the pickup unit is increased or decreased in accordance with the size of each of the semiconductor chips.

10. A method of manufacturing a semiconductor device according to claim 8, wherein the needles are comprised of a magnetic material.

11. A method of manufacturing a semiconductor device according to claim 8, wherein the pickup unit is moved vertically in the interior of the pickup element in the step (c).

12. A method of manufacturing a semiconductor device according to claim 8, wherein the openings serve as suction holes.

13. A method of manufacturing a semiconductor device according to claim 8, wherein the number of the needles is less than the number of the through holes.

14. A method of manufacturing a semiconductor device according to claim 8, wherein a portion of the needles and the remaining portion of the needles are adapted to vertically move independently of each other.

15. A method of manufacturing a semiconductor device comprising the steps of:
   (a) affixing a die attach film and a dicing film to a back surface of a semiconductor wafer, the dicing film having a center and an outer periphery;
   (b) after the step (a), dicing the semiconductor wafer and the die attach film to divide the semiconductor wafer into a plurality of semiconductor chips;
   (c) after the step (b), pulling the dicing film from the center toward the outer periphery of the dicing film with a first tensile force to cut the die attach film chip by chip; and
   (d) after the step (c), picking up the semiconductor chips together with the die attach film while pulling the dicing film from the center toward the outer periphery of the dicing film with a second tensile force smaller than the first tensile force,
      wherein the step (d) is performed by using stick-up means for picking up a back surface of the dicing film,
      the stick-up means comprising a pickup element and a pickup unit accommodated in an interior of the pickup element,
      the pickup unit comprising a plurality of needles having tips for contact with the back surface of the dicing film, a magnet for fixing rear ends of the plural needles, and a needle holder which includes a plurality of through holes each having an inside diameter slightly larger than the diameter of each of the needles and controls the attitude of the needles inserted respectively into the plural through holes,
      a length of the needle holder being shorter than a length of the needle,
      the pickup element having an upper surface including a plurality of openings for allowing the tips of the needles to project from the upper surface of the pickup element in the step (d),
      the back surface of the dicing film being pushed up by the tips of the needles in the step (d).

16. A method of manufacturing a semiconductor device according to claim 15, wherein the dicing film is pulled in step (c) so as to increase tensile force on the dicing film to the first tensile force, and wherein a speed of pulling the dicing film so as to increase tensile force on the dicing film to the first tensile force is higher than a speed of relaxing the pull on the dicing film so as to diminish the tensile force from the first tensile force to the second tensile force.

17. A method of manufacturing a semiconductor device according to claim 15, wherein a thickness of each of the semiconductor chips is 30 to 60 μm.

18. A method of manufacturing a semiconductor device according to claim 15, further comprising a step of bonding the picked-up semiconductor chips over a mounting base through the die attach film.

19. A method of manufacturing a semiconductor device according to claim 15, wherein at least a part of the die attach film remains uncut at the time of dicing the semiconductor wafer and the die attach film in the step (b), and the die attach film is cut completely at the time of pulling the dicing film with the first tensile force in the step (c).

20. A method of manufacturing a semiconductor device according to claim 15, wherein the needles are comprised of a magnetic material.

21. A method of manufacturing a semiconductor device according to claim 15, wherein the pickup unit is moved vertically in the interior of the pick up element in the step (c).

22. A method of manufacturing a semiconductor device according to claim 15, wherein the openings serve as suction holes.

23. A method of manufacturing a semiconductor device according to claim 15, wherein the number of the needles is less than the number of the through holes.

24. A method of manufacturing a semiconductor device according to claim 15, wherein a portion of the needles and the remaining portion of the needles are adapted to vertically move independently of each other.

* * * * *